(12) United States Patent
Bustard et al.

(10) Patent No.: US 12,327,589 B2
(45) Date of Patent: Jun. 10, 2025

(54) FIBRE OPTIC INTEGRATED QUANTUM MEMORY FOR LIGHT

(71) Applicant: NATIONAL RESEARCH COUNCIL OF CANADA, Ottawa (CA)

(72) Inventors: Philip J. Bustard, Ottawa (CA);
Duncan G. England, Ottawa (CA);
Benjamin J. Sussman, Ottawa (CA);
Stephen Mihailov, Ottawa (CA);
Kyrylo Hnatovsky, Ottawa (CA); Dan Grobnic, Ottawa (CA)

(73) Assignee: NATIONAL RESEARCH COUNCIL OF CANADA, Ottawa (CA)

( * ) Notice: Subject to any disclaimer, the term of this patent is extended or adjusted under 35 U.S.C. 154(b) by 118 days.

(21) Appl. No.: 18/256,074

(22) PCT Filed: Dec. 7, 2021

(86) PCT No.: PCT/CA2021/051757
§ 371 (c)(1),
(2) Date: Jun. 6, 2023

(87) PCT Pub. No.: WO2022/120477
PCT Pub. Date: Jun. 16, 2022

(65) Prior Publication Data
US 2023/0420046 A1     Dec. 28, 2023

Related U.S. Application Data

(60) Provisional application No. 63/122,209, filed on Dec. 7, 2020.

(51) Int. Cl.
*G11C 11/00* (2006.01)
*G02F 1/313* (2006.01)
(Continued)

(52) U.S. Cl.
CPC ............ *G11C 13/04* (2013.01); *G02F 1/3131* (2013.01); *G02F 1/3503* (2021.01);
(Continued)

(58) Field of Classification Search
CPC ..... G11C 13/04; G02F 1/3503; G02F 1/3131; G02F 1/3511; G02F 1/3536; G02F 1/365
See application file for complete search history.

(56) References Cited

U.S. PATENT DOCUMENTS 6,665,486 B2    12/2003  Tomita
7,489,404 B2 *   2/2009  Huignard .............. G01C 19/72
                                                    356/460

(Continued)

FOREIGN PATENT DOCUMENTS

CN      104503077      4/2015
JP      2007271725     10/2007

OTHER PUBLICATIONS

International Preliminary Report on Patentability (IPRP), PCT App. No. PCT/CA2021/051757, Jun. 13, 2023.
(Continued)

*Primary Examiner* — Pho M Luu
(74) *Attorney, Agent, or Firm* — Marks & Clerk; Paul Horbal

(57) ABSTRACT

The present invention provides an efficient quantum memory for storing a quantum state of light, such as a photon, for a temporary period of time in a fibre-integrated optical cavity and then recall the quantum state of light and quantum information at a later time with a high probability of success. The present invention uses a nonlinear optical switching mechanism to modify at least one property of the quantum light, or cavity, to trap the quantum light in the optical cavity. Subsequent application of the nonlinear optical switching mechanism switches at least one property of
(Continued)

the stored quantum light, or cavity, to release the quantum light from the optical cavity. The present invention also provides quasi-deterministic single-photon generation by temporal multiplexing of a photon pair source integrated within the cavity.

15 Claims, 18 Drawing Sheets

(51) Int. Cl.
*G02F 1/35* (2006.01)
*G02F 1/365* (2006.01)
*G11C 13/04* (2006.01)

(52) U.S. Cl.
CPC .......... *G02F 1/3511* (2013.01); *G02F 1/3536* (2013.01); *G02F 1/365* (2013.01)

(56) References Cited

U.S. PATENT DOCUMENTS

| | | | |
|---|---|---|---|
| 9,851,742 B2 | 12/2017 | Gilbert | |
| 10,067,745 B2 | 9/2018 | Sussman | |
| 10,429,718 B2 | 10/2019 | Pant | |
| 2021/0103847 A1* | 4/2021 | Akzam | G06N 10/60 |
| 2022/0138608 A1* | 5/2022 | Ramette | G06F 9/30101 |
| | | | 716/100 |

OTHER PUBLICATIONS

W. K. Wootters and W.H. Zurek, "A single quantum cannot be cloned", Nature 299, 802-803 (1982).
M. D. Eisaman, J. Fan, A. Migdall and S. V. Polyakov, "Invited Review Article: Single-photon sources and detectors", Rev. Sci. Instrum. 82, 071101 (2011).
C. Couteau, "Spontaneous parametric down-conversion", Contemporary Physics 59, 291-304 (2018).
J. Nunn, N.K. Langford, W.S. Kolthammer, T.F.M. Champion, M.R. Sprague, P.S. Michelberger, X.-M. Jin, D.G. England, and I.A. Walmsley, "Enhancing Multiphoton Rates with Quantum Memories", Physical Review Letters 110, 133601 (2013).
C. Martijn de Sterke et al., "Light trapping in a fiber grating defect by four-wave mixing", Optics Letters, vol. 27, No. 7, 2002.
P.M. Leung et al., "Quantum memory scheme based on optical fibers and cavities" Phys. Rev. A, 74, 022311 (2006).
Kabakova et al., "Bragg grating-based optical switching in a bismuth-oxide fiber with strong X(3)-nonlinearity" Optics Express 19, 5868 (2011).
N. Matsuda, "Deterministic reshaping of single-photon spectra using cross-phase modulation" Science Advances 2 e1501223 (2016).
T.B. Pittman et al., "Single photons on pseudodemand from stored parametric down-conversion", Physical Review A 66 042303 (2002).
F. Kaneda and P.G. Kwiat, "High-efficiency single-photon generation via large-scale active time multiplexing", Science Advances 5, eaaw8586 (2019).
B. J. Smith, P. Mahou, O. Cohen, J. S. Lundeen, and I. A. Walmsley, "Photon pair generation in birefringent optical fibers", Opt. Express 17, 23589 (2009).
T. B. Pittman, B. C. Jacobs, and J. D. Franson, "Single photons on pseudodemand from stored parametric down-conversion", Phys. Rev. A 66, 042303 (2002).
A. L. Migdall, D. Branning, and S. Castelletto, "Tailoring single-photon and multiphoton probabilities of a single-photon on-demand source", Phys. Rev. A 66, 053805 (2002).
J. B. Christensen, J. G. Koefoed, B. A. Bell, C. J. McKinstrie, and K. Rottwitt, "Shape-preserving and unidirectional frequency conversion by four-wave mixing", Opt. Express 26, 17145 (2018).
A. M. Weiner, J. P. Heritage, and E. M. Kirschner, "High-resolution femtosecond pulse shaping", J. Opt. Soc. Am. B 5, 1563 (1988).

H. Takesue and K. Inoue, "1.5-pm band quantum-correlated photon pair generation in dispersion-shifted fiber: suppression of noise photons by cooling fiber", Opt. Express 13, 7832 (2005).
S. Larochelle et al., "All-optical switching of grating transmission using cross-phase modulation in optical fibers," Electron. Lett. 26, 1459-1460 (1990).
C.M. Caves et al., "Quantum limits on phase-preserving linear amplifiers", Physical Review A 86, 063802 (2012).
Khabat Heshami, Duncan G. England, Peter C. Humphreys, Philip J. Bustard, Victor M. Acosta, Joshua Nunn, and Benjamin J. Sussman, "Quantum memories: emerging applications and recent advances", Journal of Modern Optics 63, S42 (2016).
McGuinness, H. J. and Raymer, M. G. and McKinstrie, C. J. and Radic, S., "Quantum Frequency Translation of Single-Photon States in a Photonic Crystal Fiber", Phys. Rev. Lett. 105, 093604 (2010).
C. Kupchak, J. Erskine, D. England and B. Sussman, "Terahertz-bandwidth switching of heralded single photons", Optics Letters 6, 1427 (2019).
O. Cohen, J.S. Lundeen, B.J. Smith, G. Puentes, P.J. Mosley, I.A. Walmsley, "Tailored Photon-Pair Generation in Optical Fibers", Physical Review Letters 102, 123603 (2009).
F. Kaneda and P.G. Kwiat, "High-efficiency single-photon generation via large-scale active time multiplexing", arXiv:1803.04803 (2018).
F. Kaneda, B. G. Christensen, J. J. Wong, H. S. Park, K. T. McCusker, and P. G. Kwiat, "Time-Multiplexed Heralded Single-Photon Source," Optica2, 1010 (2015).
G. J. Mendoza, R. Santagati, J. Munns, E. Hemsley, M. Piekarek, E. Martin-Lopez, G. D.Marshall, D. Bonneau, M. G. Thompson, and J. L. O'Brien, "Active temporal and spatial multiplexing of photons," Optica 3, 127 (2016).
X. Ma, S. Zotter, J. Kofler, T. Jennewein, and A. Zeilinger, "Experimental generation of single photons via active multiplexing," Physical Review A 83, 043814 (2011).
C. Xiong, X. Zhang, Z. Liu, M. J. Collins, A. Mahendra, L. G. Helt, M. J. Steel, D. Y.Choi, C. J. Chae, P. H. W. Leong, and B. J. Eggleton, "Active temporal multiplexing of indistinguishable heralded single photons," Nature Communications 7, 10853 (2016).
R. J. A. Francis-Jones, R. A. Hoggarth, and P. J. Mosley, "All-fiber multiplexed source ofhigh-purity single photons," Optica 3, 1270 (2016).
F. Kaneda, F. Xu, J. Chapman, and P. G. Kwiat, "Quantum-memory-assisted multi-photongeneration for efficient quantum information processing," Optica 4, 1034 (2017).
Jin et al., "Telecom-Wavelength Atomic Quantum Memory in Optical Fiber for Heralded Polarization Qubits". APS Physics, Physical Review Letters, Sep. 15, 2015, vol. 115(14), pp. 1-6, [online] [retrieved on Feb. 28, 2022 (Feb. 28, 2022)]. Retrieved from the Internet: <https://arxiv.org/abs/1506.04431>.
Meyers et al., "Fiber entangled photon pair source connecting telecom to quantum memories". Journal of Physics Communications, Dec. 7, 2017, vol. 1 No. 5, pp. 1-16, [online] [retrieved on Feb. 28, 2022 (Feb. 28, 2022)]. Retrieved from the Internet: <https://iopscience.iop.org/article/10.1088/2399-6528/aa90cc>.
R. H. Stolen, J. P. Gordon, W. J. Tomlinson, and H. A. Haus, Raman response function of silica-core fibers, J. Opt. Soc. Am. B 6, 1159 (1989).
A. M. Weiner, "Ultrafast Optics", John Wiley & Sons Inc. (2009).
Extended European Search Report issued Oct. 1, 2024 in EP Patent Application No. 21901753.0 (15 pages).
Jin et al. A telecom-wavelength atomic quantum memory in optical fiber for heralded polarization qubits. arxiv.org, Cornell University Library, 201 Olin Library Cornell University Ithaca, NY 14853, Jun. 14, 2015, XP080987355, DOI: 10.1103/PHYSREVLETT.115. 140501, 6 pages.
Bhattacherjee and Hasan. Controllable optical bistability and Fano line shape in a hybrid optomechanical system assisted by Kerr medium: Possibility of all optical switching. arxiv.org, Cornell University Library, 201 Olin Library Cornell University Ithaca, NY 14853, Aug. 13, 2017, XP081290684, DOI: 10.1080/09500340. 2018.1455917, 18 pages.

(56) References Cited

OTHER PUBLICATIONS

Doutte et al. Influence of light polarization on dynamics of continuous-wave-pumped Raman fiber lasers. Optics Letters, vol. 28(24), published Dec. 15, 2003, pp. 2464-2466.

* cited by examiner

FIBRE OPTIC INTEGRATED QUANTUM MEMORY FOR LIGHT

FIELD OF THE INVENTION

The disclosure relates to a quantum memory for a quantum state of light, for example, a single photon. Specifically, the disclosure relates to a method and apparatus for storing a quantum state of light in a quantum memory and also for providing a photon source integrated within the quantum memory.

BACKGROUND OF THE INVENTION

Decades of research in quantum mechanics shows that certain problems in computation, communication, sensing, and information processing, can be carried out by taking advantage of quantum properties of light and matter. These quantum properties include phenomena such as energy quantization, superposition, non-classical correlations, and entanglement. Light will play an important role in many of the new technologies that emerge to take advantage of these quantum properties, due to its high speed and relatively weak interactions with its environment. For example, it can be used to transmit quantum information when information is encoded in the quantum state of the light.

Light at its most basic level is composed of photons (quantized wave-packets of electromagnetic energy). There are many types of quantum states of light. For example, a single photon is one such example of a quantum state of light. More specifically, a single photon is one quantum of energy occupying a single mode of the electromagnetic field; in the language of quantum optics a single photon is a Fock state of the electromagnetic field with photon number $n=1$.

In many technologies, the ability to perform sequences of operations on a system at chosen times, or even "on demand", is critically important. Thus, it is important in present day technologies to provide effective and reliable data storage and retrieval means. For example, in a computer, information may be copied and stored temporarily in a memory before recall at a desired time. This is not possible when working with quantum states of light because the "No-cloning theorem" states that an arbitrary unknown quantum state cannot be copied [W. K. Wootters and W. H. Zurek, Nature 299, 802-803 (1982)]. Instead, researchers are trying to create a "quantum memory" in which a quantum state of light, such as a single photon, is temporarily localized, or reversibly transferred into a stationary excitation, before later release "on demand".

In existing technologies, researchers have explored mapping a quantum state of light, such as a single photon, into another type of excitation in matter to temporarily store it, before reversing the mapping at a later time. The term "signal photon" is used as a generic term to describe that there is a "signal" quantum state of light that is intended to be stored, for example. That is, there is a signal and then it is operated on by external controls. A single photon is one such example of a signal quantum state of light that could be stored in a quantum memory, but the signal photon could be some other quantum state of light.

The creation of single photons that might be used in another quantum technology (perhaps one that incorporates a quantum memory) is an active area of research [M. D. Eisaman, J. Fan, A. Migdall and S. V. Polyakov, "Invited Review Article: Single-photon sources and detectors", *Rev. Sci. Instrum.* 82, 071101 (2011)]. Some techniques use a single emitter approach, in which a single entity such as an atom or quantum dot is driven to an excited state and then subsequently emits a single photon when it relaxes. The single emitter approach has the advantage that the source can never emit two photons simultaneously; however, it is a significant technical challenge to isolate and control a single emitter. An alternative approach is to use a photon pair source such as spontaneous parametric down-conversion or spontaneous four-wave mixing [C. Couteau "Spontaneous parametric down-conversion", *Contemporary Physics* 59, 291-304 (2018); O. Cohen, J. S. Lundeen, B. J. Smith, G. Puentes, P. J. Mosley, I. A. Walmsley "Tailored Photon-Pair Generation in Optical Fibers", *Physical Review Letters* 102, 123603 (2009)]. These sources only work in a stochastic, or probabilistic, manner; this is a significant drawback. Nonetheless, it is a fundamental property of photon pair sources that they always create pairs of "daughter" photons. Thus, even though they emit photon pairs stochastically, a photon pair source can be used as a source of single photons because detection of one of the daughter photons, conventionally called the "herald photon", is used to herald the fact that a second daughter photon, conventionally called the "signal photon" is available to be used as a resource.

The probabilistic emission of photons from photon pair sources is a significant limitation for practical use: technologies such as quantum photonic computers may require hundreds of single photons to be produced simultaneously from independent sources. For example, if a photon pair source emits pairs in a given time interval with probability p and N single photons are required from N independent sources for use in a technology, the probability of success is only $p^N$ on any given attempt. As the number N of single photons required increases, the probability of success starts to approach zero, so that one has to wait a prohibitively long time to produce all of the requisite photons simultaneously. To counter this problem and make photon pair sources useful for practical applications, there has been increasing research interest in the idea of multiplexing photon pair sources—that is, combining multiple independent probabilistic photon pair sources together such that their overall success probability as a single photon source is higher. Ideally, independent sources would be multiplexed to create a deterministic single photon source that always emits a single photon on demand. Researchers have investigated the use of various properties of light for multiplexing including frequency, spatial, and temporal degrees of freedom. Quantum memories could be particularly useful for multiplexing photon pair sources, because photons created at different times could be stored temporarily and then released together when required [J. Nunn, N. K. Langford, W. S. Kolthammer, T. F. M. Champion, M. R. Sprague, P. S. Michelberger, X.-M. Jin, D. G. England, and I. A. Walmsley "Enhancing Multiphoton Rates with Quantum Memories", *Physical Review Letters* 110, 133601 (2013)].

In an effort to create a useful quantum memory, researchers have explored mapping the signal photon into another type of excitation in matter, before reversing the mapping at a later time. Effectively, the signal photon is annihilated in a controlled way to create a storage excitation, and then the storage excitation is annihilated in a controlled way to create a new signal photon. Both the storage excitation used and the method of mapping the signal photon into the memory are active areas of research.

Storage excitations generally used include: "spin-waves" on the energy levels of atomic ensembles and rare-earth-ion-doped crystals; acoustic phonons in an optical fibre; optical phonons in a diamond crystal; optical phonons in an ensemble of hydrogen molecules; microwaves in a cavity; and an electronic excitation in a single atom in an optical cavity.

In such systems, protocols for mapping the signal photon into the memory include: optically controlled memories; electromagnetically induced transparency; Raman scattering protocol; Autler-Townes protocol; engineered absorption; controlled reversible inhomogeneous broadening; atomic frequency combs; gradient echo memory; and retrieval of silenced echo. Furthermore, hybrids of these protocols also exist. Additionally, buffering the signal photon in a free-space cavity, or an optical fibre cavity, has been explored experimentally and theoretically.

There are notable limitations and disadvantages of the present existing technologies. Optically controlled memories use bright coherent pulses of light which can introduce spurious noise photons through unwanted processes like fluorescence and four-wave mixing. These degrade the quality of the memory operation. High-efficiency memory operation is a pre-requisite for many processes. Some protocols are theoretically limited to well-below unit efficiency. High efficiency is theoretically possible in some protocols with engineered absorption, but reaching the requisite optical depth is a persistent challenge. The requisite storage time for a quantum memory depends on the application. For example, uses in long-distance communication require long storage times (milliseconds to seconds), while more compact technologies could operate with more modest storage times (nanoseconds to microseconds). A large variety of storage times have been reported in the literature, with the storage time usually depending on the chosen storage excitation.

The frequency and bandwidth of the stored signal photon is important for most applications. Memory operation in the telecoms C-band is particularly desirable for long-distance quantum communication, for example, because of compatibility with optical fibres. Many of the existing quantum memory technologies are not tuneable in frequency or bandwidth because of the energy-level structure of the storage medium.

The time-bandwidth product is the product of the memory lifetime with the bandwidth of the stored signal photon. It effectively measures how many distinct photon wave packets could be stored in the memory. This is particularly important for use in repeat-until-success protocols, such as multiplexing the operation of one or more photon pair sources as a single photon source.

The publication by C. Martijn de Sterke et al., "Light trapping in a fiber grating defect by four-wave mixing", discloses an area of research in physics related to nonlinear optics and gratings. The disclosure of Martijn de Sterke et al. is directed to creating light within a fiber Bragg grating defect which constitutes a cavity between two fiber Bragg gratings, one at each end. The disclosure of Martijn de Sterke et al. does not relate to operating a quantum memory, and it does not disclose a method which is capable of storing and retrieving a quantum state of light, such as a single photon. The presently referenced publication specifically states: "Here we demonstrate an effective way to launch energy into a localized state by four-wave mixing (FWM): A strong pump pulse, seeded with a cw idler, generates a signal with a frequency that equals an eigenfrequency of the well." Thus, Martijn de Sterke et al. disclose a way of trapping light in a fibre Bragg grating defect, but the light that is stored in the defect is not the light that is input to the fibre. Further, Martijn de Sterke et al. do not disclose a way of transferring a quantum photonic excitation from outside a fibre cavity and then into the fibre, before later reversing the process. Instead, they propose a technique where an input "idler" is amplified by FWM induced by a strong pump pulse; as a consequence of energy conservation, this amplification of the idler also creates a weak signal pulse that is trapped in the defect.

It is an established principle of quantum physics that "all phase-preserving linear amplifiers add noise, thereby degrading the signal-to-noise ratio of the input . . . " [see "Quantum limits on phase-preserving linear amplifiers", C. M. Caves et al. Physical Review A 86, 063802 (2012) and references therein]. Since the seeded FWM amplification process described by Martijn de Sterke et al. is a type of phase-preserving linear amplifier, the weak signal pulse created in the defect will be degraded by noise and so it is not possible to use the disclosed method as a quantum memory. Martijn de Sterke et al. also suggest using the inverse process to obtain an output idler pulse after some time delay: "The energy deposited in the well, in combination with a strong pump, leads to a (weak) field at the idler frequency." This process is again a type of seeded FWM amplification, but now with the signal in the defect amplified by a strong pump and a weak idler created that is not trapped in the defect. Thus, the "read out" process described by Martijn de Sterke et al. does not transfer out the excitation in the cavity and the idler created outside the cavity will be degraded by noise; as a result, it is not possible to use their method as a quantum memory.

The publication by Patrick M. Leung et al., "Quantum memory scheme based on optical fibers and cavities" discloses the idea of trapping a quantum state of light in an optical fibre consisting of an optical fibre that is optically coupled to two narrow-linewidth cavities. The narrow-linewidth cavities reflect or transmit a given frequency depending on the optical distance between the reflective elements that comprise each narrow-linewidth cavity (NLC). Together, their NLC-fibre-NLC sequence forms a composite cavity in which a photon could be trapped, acting as a quantum memory. In order to operate their quantum memory, Leung et al. proposes to mechanically change the spacing of the reflective elements in one of the narrow-linewidth cavities with timing appropriate to permit the entrance of an incident signal photon. After the signal photon is transmitted into the fibre, it continues towards the second NLC where it is subsequently reflected. The spacing of the input NLC would again be mechanically adjusted so that when the signal photon returns the transmission frequency is now different and the signal photon is reflected. At a later time, to release the photon the spacing of an end NLC would again be adjusted mechanically.

A technical problem with the scheme disclosed by Leung et al. is that mechanical adjustment of the NLC is difficult to achieve with sufficient speed in order to operate the device as a useful quantum memory. It is a clear feature of Leung et al. that they only envisage the use of mechanical switching of narrow-linewidth cavities. This places restrictions on the speed with which the device can operate and it places restrictions on the bandwidth of the photons that can be stored within the memory because the bandwidth is set by the narrow-linewidth cavity.

U.S. Pat. No. 10,429,718, by Decap et al. is directed to Apparatus and Methods for Single Photon Sources and discloses a photon source to deliver single photons that includes a storage ring resonator to receive pump photons and generate a signal photon and an idler photon. An idler resonator is coupled to the storage resonator to couple the idler photon out of the storage resonator and into a detector.

Detection of the idler photon stops the pump photons from entering the storage resonator. A signal resonator is coupled to the storage resonator to couple out the signal photon remaining in the storage resonator and delivers the signal photon to applications. The photon source can be fabricated into a photonic integrated circuit (PIC). However, integration with fibre optic networks is likely to be a challenge because of imperfect mode-matching between the PIC and optical fibre. Furthermore, the loss per unit length of propagation in PICs is typically much larger than in optical fibre, for example. Decap et al. discloses the idea of switching the resonance frequencies of their resonators using piezo-electric mechanical switching, electric switching, temperature switching, mechanical switching, magnetic switching, acoustic switching, and photo-switching for the case of a chalcogenide signal resonator.

SUMMARY OF THE INVENTION

The present invention attempts to solve the problem associated with existing technologies in terms of storing a quantum state of light for a temporary period and then recall it at a later time with high fidelity to the input state and a high probability of success. The present inventors attempt to solve problems with current technologies where much research has gone into ways of temporarily storing quantum states of light in a quantum memory but with limited success. The present inventors attempt to solve this problem where this capability would allow the construction of other technologies, for example including quantum repeaters for quantum communication and multiplexed heralded single photon sources, or even multiplexed heralded multi-photon sources.

The present invention additionally attempts to solve a secondary problem in quantum photonics by using specific features of their quantum memory design as part of a multiplexed single photon source; that secondary problem is: the creation of true single photons "on demand" for use in quantum technologies. The present inventors attempt to solve this problem associated with existing technologies where creation of a "true" single photon (a "Fock state" with photon number equal to one), or other photon state with a definite photon number higher than one, is difficult to do because most sources of light emit a great many photons in an uncontrolled or stochastic way. The inventors of the present invention propose a system that eliminates the disadvantages associated with prior art systems. The present inventors propose a fibre optic cavity that enables a photon from the outside the cavity to be received by and placed inside the cavity and stored there for a period of time, creating a quantum memory for the photon, where the quantum state of the photon and the quantum information can be read after a period of time. This would enable use of the present invention in numerous applications where it is desirable to store quantum information from light.

It is an envisioned application of the quantum memory disclosed herein that it will be well-suited to use in single photon generation by multiplexing. It is a specific advantage of the quantum memory invention disclosed herein that, in some realizations, it will be possible to incorporate a photon pair source within the quantum memory such that the memory can be used both as a quantum memory and as a single photon source that operates by temporal multiplexing.

The present invention also proposes to use switching of the photon properties as a switching mechanism to control its storage and release. This feature further distinguishes the present invention from the prior art of cavity storage in which only the methods of switching the optical cavity are used.

Another useful feature of the present invention is the ability to deliver single photons on-demand, or at least "pseudodemand" with a much greater probability of success. The fact that the storage frequency, or wavelength, of the present invention can be chosen by the user during the cavity fabrication stage is a clear advantage over many alternative memories, which are often linked to specific atomic absorption lines. The present invention is therefore much more flexible for integration with existing photon pair sources.

According to an aspect of the present invention, there is provided a fibre optic quantum memory for storing a quantum state of light, comprising of:
  an optical fibre having an optical cavity integrated into the optical fibre;
  reflective elements integrated within the optical fibre at opposing ends of the optical fibre, the respective elements forming a part of the optical fibre; and
  a nonlinear optical switching mechanism for selectively storing quantum light from an external source within the cavity;
wherein the first application of the switching mechanism modifies at least one property of the quantum light such that the reflective elements trap the quantum light within the cavity,
wherein a subsequent application of the switching mechanism modifies the at least one property of the quantum light such that the quantum light can be extracted from the cavity, and
wherein quantum information encoded in the quantum light is preserved during storage in the cavity.

According to another aspect of the present invention, there is provided a fibre optic quantum memory for storing a quantum state of light, comprising of:
  an optical fibre having an optical cavity integrated into the optical fibre;
  reflective elements integrated within the optical fibre at opposing ends of the optical fibre, the respective elements forming a part of the optical fibre; and
  a nonlinear optical switching mechanism for selectively modifying at least one property of at least one reflective element of the cavity such that the reflective element can be induced to transmit a quantum state of light incident on the reflective element;
wherein the first application of the switching mechanism transiently modifies at least one property of the reflective element such that it transmits an incident quantum state of light into the fibre,
wherein the quantum state of light is then trapped within the fibre cavity because the switching mechanism is no longer applied,
wherein a subsequent application of the nonlinear optical switching mechanism modifies at least one property of the reflective element such that it transmits the quantum state of light so that it exits the fibre, and
wherein quantum information encoded in the quantum light is preserved during storage in the cavity.

According to another aspect of the present invention, there is provided a fibre optic quantum memory acting as a photon source comprising:
  an optical fibre having an optical cavity integrated into the optical fibre; and
  reflective elements integrated within the optical fibre at opposing ends of the optical fibre, the respective elements forming a part of the optical fibre; and a photon pair source integrated therein, the photon source comprising a photon pair generating mechanism for creating an entangled photon pair within the fibre using a spontaneous process; and a nonlinear optical switching mechanism for selectively extracting the first photon of the photon pair from the cavity by modifying at least one property of the first photon of the photon pair, wherein the first photon of the photon pair is resonant with the reflective elements in the cavity, so the photon is retained in the cavity until its subsequent release, wherein the second photon of the photon pair is not resonant with the reflective elements, so the second photon exits the cavity, and is used to herald a presence of the first photon retained in the cavity, and wherein subsequent application of a nonlinear optical switching mechanism modifies at least one property of the stored photon such that the photon retained in the cavity can now exit the cavity.

According to another aspect of the present invention, there is provided a fibre optic quantum memory acting as a photon source comprising:

an optical fibre having an optical cavity integrated into the optical fibre;

reflective elements integrated within the optical fibre at opposing ends of the optical fibre, the respective elements forming a part of the optical fibre;

a photon pair source integrated therein, the photon source comprising a photon pair generating mechanism for creating an entangled photon pair within the fibre cavity using a spontaneous process; and a nonlinear optical switching mechanism for selectively extracting one of the photons of the photon pair from the cavity by modifying at least one property of at least one reflective element in the cavity, wherein the first photon of the photon pair is resonant with the reflective elements in the cavity so is retained in the cavity until its subsequent release, wherein the second photon of the photon pair is not resonant with the reflective elements, so the second photon exits the cavity, and is used to herald a presence of the first photon retained in the cavity, and wherein subsequent application of the nonlinear optical switching mechanism modifies the at least one property of the at least one reflective element such that the photon retained in the cavity can now exit the cavity.

In some embodiments of the present invention, at least one of the reflective elements comprises a fibre Bragg grating defining a fibre mirror.

In some embodiments of the present invention, at least one of the reflective elements comprises dielectric stacks coated directly on the tip of the fibre.

In some embodiments of the present invention, the optical switching mechanism comprises Bragg-scattering four-wave mixing.

In some embodiments of the present invention, the optical switching mechanism comprises cross-phase modulation.

In some embodiments of the present invention, the optical switching mechanism comprises rotating the polarization of the quantum light via the optical Kerr effect.

In some embodiments of the present invention, the at least one property of the quantum light that is switched comprises frequency, polarization, or both.

In some embodiments of the present invention, the at least one property of the photon that is switched comprises frequency, polarization, or both.

In some embodiments of the present invention, the optical switching mechanism comprises shifting the resonance frequency of the fibre Bragg grating via the optical Kerr effect.

In some embodiments of the present invention, the quantum state of light comprises a single photon.

In some embodiments of the present invention, the spontaneous process comprises spontaneous four-wave mixing.

The invention disclosed herein differs from that of Martijn de Sterke et al. as Martin de Sterke et al. does not disclose or suggest the use of Bragg Scattering four-wave mixing, or the optical Kerr effect, or cross-phase modulation, to switch photons, or other quantum states of light, into a fibre integrated cavity for temporary storage prior to later release. Martijn de Sterke et al. does not envisage or disclose the possibility of using spontaneous four-wave mixing, sometimes called unseeded modulation instability, to create a single photon in a fibre cavity, with external detection to "herald" the creation and storage of a single signal photon. Furthermore, as discussed above, Martijn de Sterke et al. does not disclose a method of switching a single signal photon, or other quantum photonic state, out of a fibre cavity.

The invention disclosed herein differs from that of Leung et al. because the disadvantages of Leung et al. with respect to speed and bandwidth are avoided by using nonlinear optical processes to switch the properties of the signal photon and/or the properties of the fibre cavity end mirrors. Optical switching by nonlinear optical processes can be achieved with much greater speed than mechanical switching and so this constitutes a significant advantage over the prior art of Leung et al. The greater speed of the invention disclosed herein also increases the optical bandwidth of the signal photons that can be stored in the memory, giving another significant advantage over the proposal of Leung et al.

The invention disclosed herein differs from that of Decap et al. as Decap et al. disclose using a ring resonator which is a nanostructure and the disclosure is specifically directed to creating a single photon source, not a memory. Decap et al. do not disclose using a fibre optic cavity. Optical fibre offers very low loss per unit length of propagation which the nanostructure of Decap et al. cannot provide. Decap et al. additionally also fail to teach or disclose the concept of taking a photon from outside the cavity and putting it inside the cavity and leaving it there for a while and getting it back out of the cavity. There is no such disclosure in Decap et al. of providing a memory aspect and the higher losses relative to optical fibre would likely prevent Decap et al. from storing a photon beyond 10 ns. Furthermore, interfacing the light from a ring resonator with a fibre optic network is a challenge that will add significant losses. Furthermore, Decap et al. do not disclose the idea of using nonlinear optical effects to switch the frequency and/or polarization properties of the photon or photons trapped within their ring resonator cavities.

Optical switching by nonlinear optical processes can be achieved with much greater speed than mechanical switching and so this constitutes a significant advantage over the prior art for storing photons in a fibre optic cavity. The greater speed of the invention disclosed herein also increases the optical bandwidth of the signal photons that can be stored in a fibre-integrated quantum memory based on switching, giving another significant advantage over the prior art.

It follows that in some embodiments, the proposed memory allows a photon that is a broadband photon to be stored, which is an additional advantage of the present invention. A photon is essentially a wave packet of energy having a particular length —termed the length of the photon and the length of the photon determines how long the wave-packet is in time and space. The proposed broadband photons in accordance with some embodiments of the present invention, have a duration of several picoseconds, for example, between about 1 ps to about 100 ps. The proposed optical fibre memory that is proposed provides a duration in terms of bandwidth that is termed a broadband photon as it enables a short photon to be stored that has a broad frequency spectrum. Thus, the fibre optic memory of the present invention could in principle be much more broadband than many alternative techniques, in addition to providing cheaper building and commercial viability and additionally provides low loss. In some examples of the optical fibre of the present invention, in particular, single mode fibre is provided for example that is SMF-28 which has incredibly low loss per unit length of propagation compared to a micro-ring resonator. As a result, the presently proposed fibre optic memory provides a quantum memory solution that would allow a photon to be retained in memory for a much longer period of time.

Accordingly, the present disclosure provides a solution for temporarily storing quantum states of light in a "quantum memory". This capability would allow the construction of other technologies, including quantum repeaters for quantum communication, multiplexed heralded single photon sources, or multiplexed heralded multi-photon sources, for example.

BRIEF DESCRIPTION OF THE DRAWINGS

In order that the invention may be readily understood, embodiments of the invention are illustrated by way of examples in the accompanying drawings, in which.

DETAILED DESCRIPTION OF EMBODIMENTS OF THE PRESENT INVENTION

Figure 1:
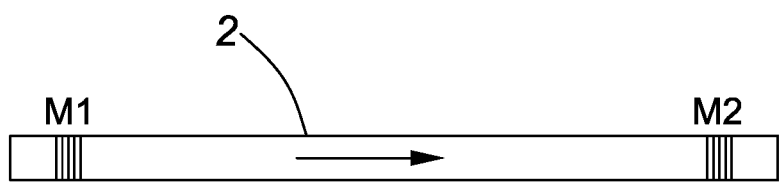
FIG. 1 shows an optical fibre used in accordance with embodiments of the present invention.

With specific reference now to the drawings in detail, it is stressed that the particulars shown are by way of example and for the purposes of illustrative discussion of certain embodiments of the present invention only. Before explaining at least one embodiment of the invention in detail, it is to be understood that the invention is not limited in this application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Optical Cavity

In all embodiments of the invention, an optical fibre according to the present invention has reflective elements, or mirrors, M1 and M2, integrated at opposite ends of the fibre. The mirrors M1 and M2 may be fibre Bragg gratings (FBGs) inscribed within the fibre, or they may be dielectric stacks grown, or fabricated, on the end of the fibre. It is an important feature of the invention that the mirrors M1 and M2 will be designed to reflect, with high efficiency, photons with a designer-selected frequency $\omega_{cavit}$ and polarization $\hat{e}_{cavity}$. That is, a photon, or photons, with frequency $\omega_{cavity}$ and polarization $\hat{e}_{cavity}$ within the fibre will reflect back and forth between mirrors M1 and M2. The combination of the optical fibre and the integrated mirrors is therefore a type of optical cavity. It is furthermore an important feature of the invention that the mirrors M1 and M2 will have low reflectivity, that is, high transmittivity, for light at various other designer-selected frequencies and polarizations. In some realizations of the invention, the reflectivity will be independent of polarization and will only depend on frequency; in other realizations of the invention, the reflectivity will depend on both polarization and frequency.

FIG. 1 shows a setup for the quantum memory according to the present invention. In FIG. 1, an optical fibre 2 is shown. Mirrors M1 and M2 are integrated at opposite ends of the optical fibre 2. The optical fibre 2 has an optical cavity integrated therein. As mentioned above, the mirrors M1 and M2 may be FBGs in some embodiments. In other embodiments, the mirrors may be dielectric stacks. The dielectric stacks may be coated or grown on the two ends of the optical fibre 2.

Protocol for Switching Light Into and Out from the Cavity

In the main realizations of the invention, an input signal photon with frequency $\omega_s \neq \omega_{cavity}$ and polarization $\hat{e}_s \neq \hat{e}_{cavity}$ is directed into the optical fibre along with one or more ancillary control pulses with frequencies $\omega_p \neq \omega_{cavity}$ and $\omega_q \neq \omega_{cavity}$. The control pulses are input with a timing appropriate to ensure that they overlap spatially and temporally with the signal photon for some of the propagation time between M1 and M2. During the propagation from M1 to M2, the ancillary control pulses induce by a nonlinear optical interaction a change in the frequency and/or polarization of the signal photon from frequency $\omega_s \neq \omega_{cavity}$ and polarization $\hat{e}_s \neq \hat{e}_{cavity}$ to frequency $\omega_r = \omega_{cavity}$ and polarization $\hat{e}_r = \hat{e}_{cavity}$. As a result, when the signal photon reaches mirror M2, it is reflected and is thus trapped, or stored, within the fibre-integrated optical cavity. After a storage period determined by the operator, a second ancillary control pulse, or set of ancillary control pulses, with frequencies $\omega_p \neq \omega_{cavity}$ and $\omega_q \neq \omega_{cavity}$ is input to the optical fibre. The control pulses are input with a timing appropriate to ensure that they overlap spatially and temporally with the signal photon for some of the propagation time between M1 and M2. During the propagation from M1 to M2, the ancillary control pulses induce by a nonlinear optical interaction a change in the frequency and/or polarization of the signal photon from frequency $\omega_r = \omega_{cavity}$ and polarization $\hat{e}_r \neq \hat{e}_{cavity}$ to frequency $\omega_s \neq \omega_{cavity}$ and/or polarization $\hat{e}_s \neq \hat{e}_{cavity}$. As a result, when the signal photon next reaches mirror M2, it will exit the optical fibre, completing the protocol.

The nonlinear optical interaction used to modify the properties of the signal photon could be any of the following nonlinear optical interactions based on the third-order optical susceptibility of the optical fibre cavity:

i) the optical Kerr effect (OKE) to induce a temporary birefringence in the optical fibre which modifies the polarization state of the signal photon and leaves its frequency substantially unchanged;
ii) Bragg-scattering four-wave mixing (BS FWM) to induce a shift of the signal photon frequency;
iii) Bragg-scattering four-wave mixing (BS FWM) to induce a shift of the signal photon frequency and polarization state; and
iv) cross-phase modulation to induce a shift of the signal photon frequency.

Alternatively, the nonlinear optical interaction used could transiently modify the reflection frequency of the cavity end mirrors by the optical Kerr effect.

Polarization Switching using the Optical Kerr Effect for Switching Light Into and Out from the Cavity For the optical Kerr effect, $\omega_s = \omega_r = \omega_{cavity}$, but $\hat{e}_s$ is orthogonal to $\hat{e}_r = \hat{e}_{cavity}$. That is, in this realization, only the polarization of the signal photon will be switched. An ancillary control pulse with polarization at 45 degrees to $\hat{e}_s$ induces a temporary birefringence by the optical Kerr effect so that the polarization of the input signal photon is rotated by 90 degrees from $\hat{e}_s$ to $\hat{e}_r = \hat{e}_{cavity}$. The photon is then trapped in the cavity; this can later be reversed by the same interaction.

FIGS. 2a to 2f show the operation of the optical fibre 2 of FIG. 1 as a polarization switch where the optical Kerr effect is used as the nonlinear optical interaction.

The optical cavity comprises the optical fibre 2 and mirrors M1 and M2. As mentioned above, the mirrors M1 and M2 could comprise FBGs in some embodiments or dielectric stacks in other embodiments.

Figure 2A:
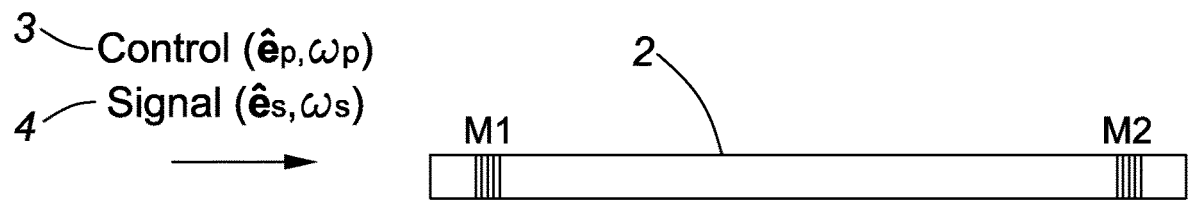
FIGS. 2a to 2f describe the generation of the quantum memory based on polarization switching induced by the optical Kerr effect in accordance with an embodiment of the present invention.

FIG. 2a shows the pulses that are input into the optical fibre 2. A weak input signal pulse 4 is directed into the optical fibre 2. The input signal pulse 4 has a frequency band centered at $\omega_s$. Furthermore, the input signal pulse 4 has a polarization unit vector denoted by $\hat{e}_s$. The input signal pulse 4 enters the optical fibre 2 with vertical polarization. A control pulse 3 is also directed into the optical fibre 2. However, the control pulse 3 is polarized at 45 degrees relative to the polarization of the input signal pulse 4. The timing of the control pulse 3 is delayed with respect to the input signal pulse 4 so that the control pulse 3 will spatially and temporally overlap with the signal photon contained in the input signal pulse 4 within a region of the optical fibre 2 between the two mirrors M1 and M2. As the control pulse 3 and the input signal pulse 4 are directed into the optical fibre 2, these pulses propagate through mirror M1 and enter the optical fibre 2. The mirrors M1 and M2 are polarization dependent at frequency $\omega_s$, that is they reflect horizontal polarization and transmit vertical polarization.

Figure 2B:
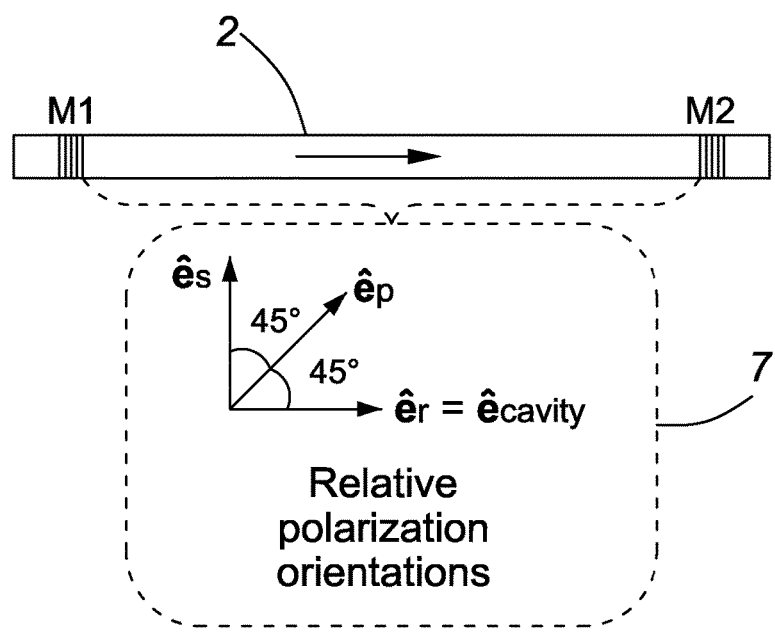

In FIG. 2b, the arrow in optical fibre 2 represents the control pulse 3 and the input signal pulse 4 propagating through the cavity of the optical fibre 2. In the present embodiment, the polarization of the input signal pulse 4 is switched by the optical Kerr effect, the nonlinear optical interaction induced by the control pulse 3. The optical Kerr effect is used to induce a temporary birefringence in the optical fibre 2 which modifies the polarization state of the input signal pulse 4. In particular, the polarization of the input signal pulse 4 is rotated by 90 degrees as shown by polarization graph 7. The resulting polarization of the input signal pulse 4 is denoted by $\hat{e}_r$. As described above, the polarization $\hat{e}_r$ is equal to $\hat{e}_{cavity}$.

On reaching mirror M1, the control pulse 3 continues to propagate out of the optical fibre 2. Due to the optical Kerr effect, the input signal pulse 4 has been mapped from polarization $\hat{e}_s$ to polarization $\hat{e}_r$ such that on reaching mirror M1, the input signal pulse 4 (containing the signal photon) is reflected back towards mirror M1. As mentioned above, the mirrors M1 and M2 are polarization dependent and reflect horizontal polarization while transmitting vertical polarization.

Figure 2C:
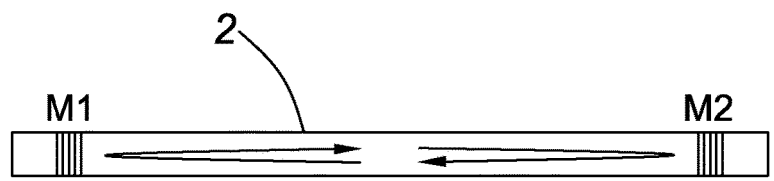

FIG. 2c shows that the signal photon (polarization $\hat{e}_r$) reflects back and forth between mirrors M1 and M2 and hence is trapped inside the cavity of the optical fibre 2. As the signal photon cannot propagate through mirror M1 or M2, the signal photon can be said to be stored in the optical fibre 2, hence the creation of a storage memory for a single photon.

Figure 2D:
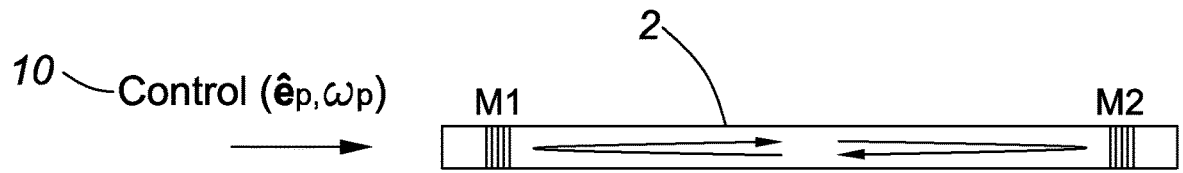

After a chosen storage time, a new control pulse 10 is directed into the optical fibre 2 as shown in FIG. 2d. Control pulse 10 has a center frequency $\omega_p$. Similar to control pulse 3, control pulse 10 is timed to spatially and temporally overlap with the signal photon within a region of the optical fibre 2 between mirrors M1 and M2.

Figure 2E:
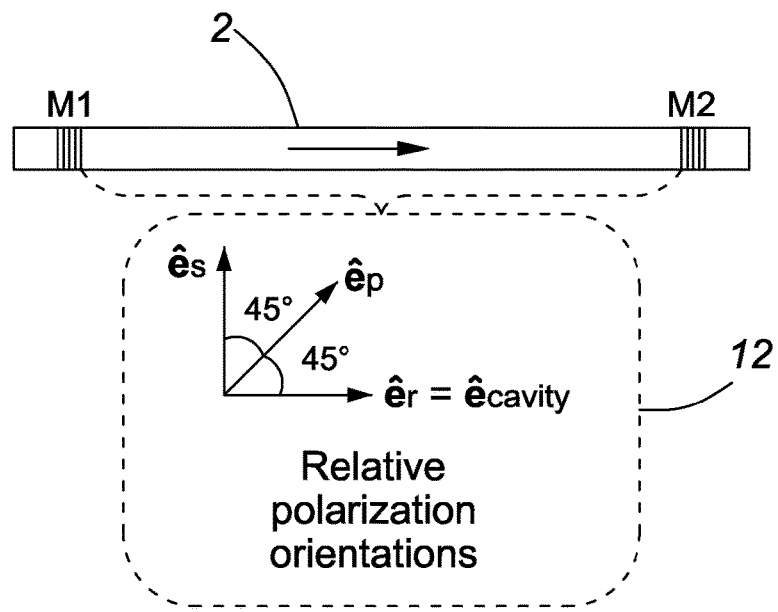

In FIG. 2e, control pulse 10 induces the optical Kerr effect to reverse the polarization state of the signal photon such that the signal photon is mapped from polarization $\hat{e}_r$ back to polarization $\hat{e}_s$. The polarization of the signal photon $\hat{e}_r$ is rotated by 90 degrees to $\hat{e}_s$ as shown by polarization graph 12.

Figure 2F:
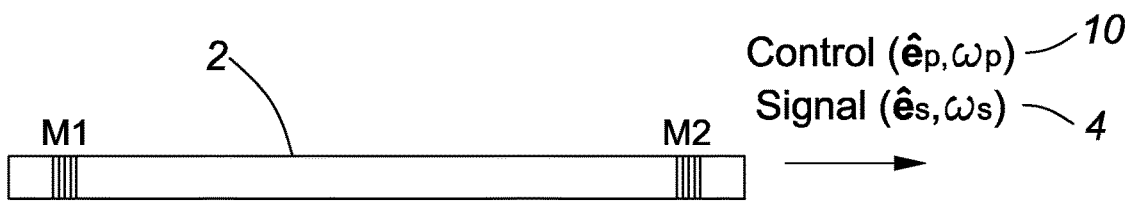

As the polarization of the signal photon has been switched back to $\hat{e}_s$ it is no longer trapped in the cavity of the optical fibre 2. It is able to propagate through mirror M2 (or mirror M1) and exit the optical fibre 2 as shown in FIG. 2f. Similar to control pulse 3, control pulse 10 propagates through mirror M1 or mirror M2 and also exits the optical fibre 2.

In FIG. 2a-f, both mirrors M1 and M2 are envisaged to have polarization-dependent reflectivity; however, it is straightforward to imagine a scenario in which only mirror M1 has polarization-dependent reflectivity. In this case, the signal 4 would enter the cavity through mirror M1 and later exit the cavity through M1 after the storage period.

Frequency Switching using Bragg-Scattering Four-Wave Mixing for Switching Light Into and Out from the Cavity For Bragg-scattering four-wave mixing (BS FWM), $\omega_s \neq \omega_r$. The control pulses with frequencies $\omega_p$ and $\omega_q$ are chosen to induce the frequency shift $\omega_s$ to $\omega_r = \omega_{cavity}$. That is, for energy conservation, the frequencies must satisfy $\omega_p + \omega_s = \omega_q + \omega_r$. In some realizations the control pulses will have the same polarization $\hat{e}_p = \hat{e}_q$, so that the polarization of the input signal photon is unchanged by BS FWM. In other realizations, the control pulse polarizations will be different, so that the polarization of the input signal photon is changed along with the frequency by BS FWM; a specific example of this is given in a following section. The important point for the memory operation is that after the BS FWM interaction, the signal photon has been mapped from a frequency and polarization state that is not reflected by the cavity end mirrors, to a state that is reflected by the cavity end mirrors. BS FWM can subsequently be repeated to map the photon from the frequency $\omega_r = \omega_{cavity}$ and polarization $\hat{e}_r = \hat{e}_{cavity}$ back to $\omega_s \neq \omega_{cavity}$ and polarization $\hat{e}_s \neq \hat{e}_{cavity}$. The photon will then exit the fibre when it is transmitted by mirror M2.

FIGS. 3a to 3f describe the operation of using BS FWM as an optical frequency switch to switch the light into and out from the cavity and to trap a signal photon within an optical cavity.

Figure 3A:
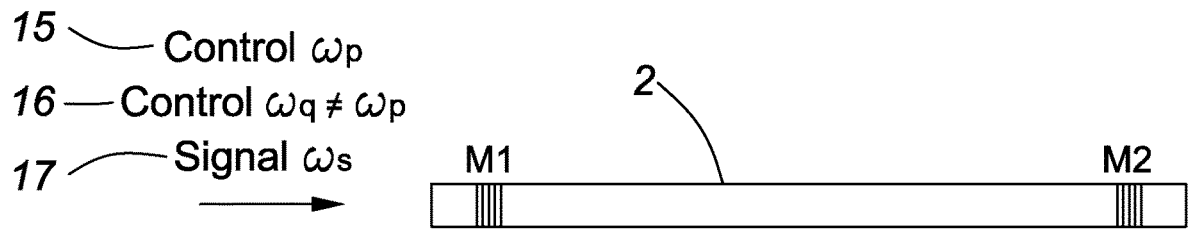
FIGS. 3a to 3f describe the generation of the quantum memory based on frequency switching induced by Bragg scattering four-wave mixing in accordance with another embodiment of the present invention.

FIG. 3a shows the pulses that are input into the optical fibre. To trap the photon in the optical fibre cavity, it is proposed to use optical switching using bright control laser pulses. In the embodiment as shown in FIG. 3a, two control pulses, 15 and 16 are used. Control pulses 15 and 16 are coherent laser pulses and are centered at different frequencies to induce a frequency shift on the signal photon, but not a change of polarization. Control pulse 15 is centered at frequency $\omega_p$ and control pulse 16 is centered at frequency $\omega_q$. The control pulses 15 and 16 could be at wavelengths of anything from 400 nm (749 THz) to 3000 nm (99.9 THz), but the most likely range is from 700 nm (428 THz) to 2000 nm (149.9 THz). A weak input signal pulse 17 is also directed into the optical fibre. The weak input signal pulse is defined as a quantum state of light where the most common realization will be a signal pulse comprising a single photon. Input signal pulse 17 is centered at frequency $\omega_s$. The polarization unit vector of the weak input pulse is denoted by $\hat{e}_s$. For the frequency band centered at the frequency $\omega_{cavity}$ at which the optical fibre 2 is designed to act as a cavity, the mirrors M1 and M2 will have high reflectivity. The reflectivity will be as high as possible (e.g. from 95% to 100%) at the cavity frequency $\omega_{cavity}$. Conversely, the reflectivity will be as low as possible (e.g. zero as close as is practically possible) for the other frequencies $\omega_s \neq \omega_{cavity}$, $\omega_p \neq \omega_{cavity}$, and $\omega_q \neq \omega_{cavity}$. In practice, it will be a reflectivity of 1 to 10% at frequencies $\omega_s$, $\omega_p$ and $\omega_q$.

Returning to FIG. 3a, as the input signal pulse 17 and the control pulses 15 and 16 are directed into optical fibre 2. The timing of the control pulses 15 and 16 is delayed with respect to the input signal pulse 17 so that the control pulses 15 and 16 will spatially and temporally overlap with the signal photon contained in the input signal pulse 17 within a region of the optical fibre 2 between the two mirrors M1 and M2. As the control pulses and 16, and the input signal pulse 17 are directed into the optical fibre 2, these pulses propagate through mirror M1 and enter the optical fibre 2.

Figure 3B:
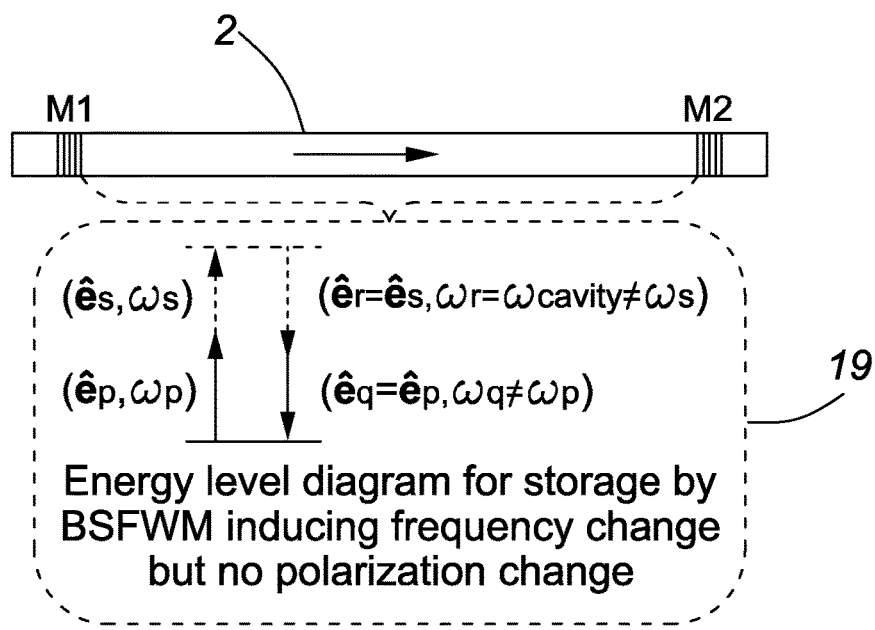

FIG. 3b depicts the control pulses 15, 16 and input signal pulse 17 propagating through the optical fibre 2. In the present embodiment, BS FWM is induced by the control pulses 16. By using BS FWM, the single photon in the weak input signal pulse 17 is shifted by the frequency difference between the control pulses 15, 16 ($\omega_p - \omega_q$). In particular, input signal pulse 17 is up-shifted in frequency to $\omega_r = \omega_s + (\omega_p - \omega_q)$. A main advantage of the use of BS FWM over seeded four-wave mixing and spontaneous four-wave mixing is the absence of inherent spontaneous noise. If no signal is input at the s-field frequency, no photons are output at the r-field frequency.

Referring to FIG. 3b, an energy level diagram 19 graphically shows the conditions needed for the energy conservation condition to be satisfied, so that the optical switching can proceed. On reaching mirror M2, the control pulses 15 and 16 continue to propagate out of the optical fibre 2. The frequency of the input signal pulse 17 containing the signal photon has been mapped from $\omega_s \neq \omega_{cavity}$ to $\omega_r = \omega_{cavity}$ such that on reaching mirror M2, the input signal pulse 17 is reflected back towards mirror M1. As mentioned above, the mirrors M1 and M2 have a high reflectivity for a frequency band centered at $\omega_{cavity}$. In other words, the mirrors M1 and M2 are dichroic in that they reflect frequencies centered at $\omega_{cavity}$ and transmit frequencies not equal to $\omega_{cavity}$.

Figure 3C:
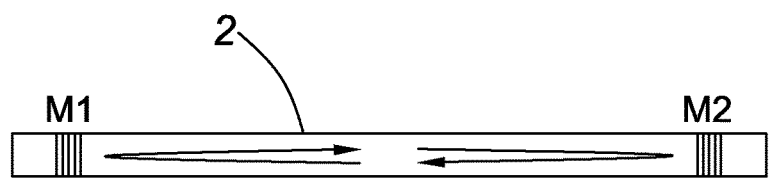

FIG. 3c shows that the signal photon with frequency $\omega_r$ reflects back and forth between mirrors M1 and M2 and hence is trapped inside the cavity of the optical fibre 2. As the signal photon cannot propagate through mirror M1 or M2, the signal photon can be said to be stored in the optical fibre 2, hence the creation of a storage memory for a signal photon.

Figure 3D:
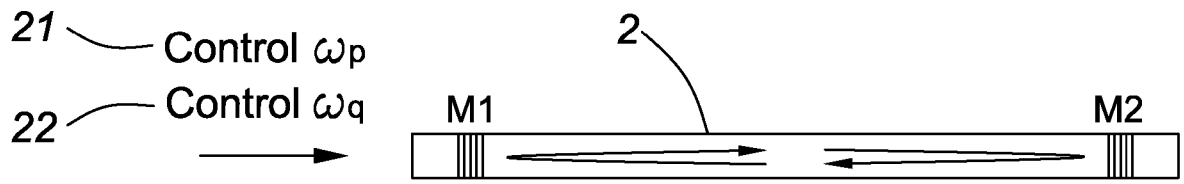

After a time delay chosen by an operator (chosen storage time), two new control pulses 21 and 22 are directed into the optical fibre 2 as shown in FIG. 3d. Control pulse 21 has a center frequency $\omega_p$ and control pulse 22 has a center frequency $\omega_q$. Similar to control pulses 15 and 16, control pulses 21 and 22 are timed to spatially and temporally overlap with the signal photon within a region of the optical fibre 2 between mirrors M1 and M2.

Figure 3E:
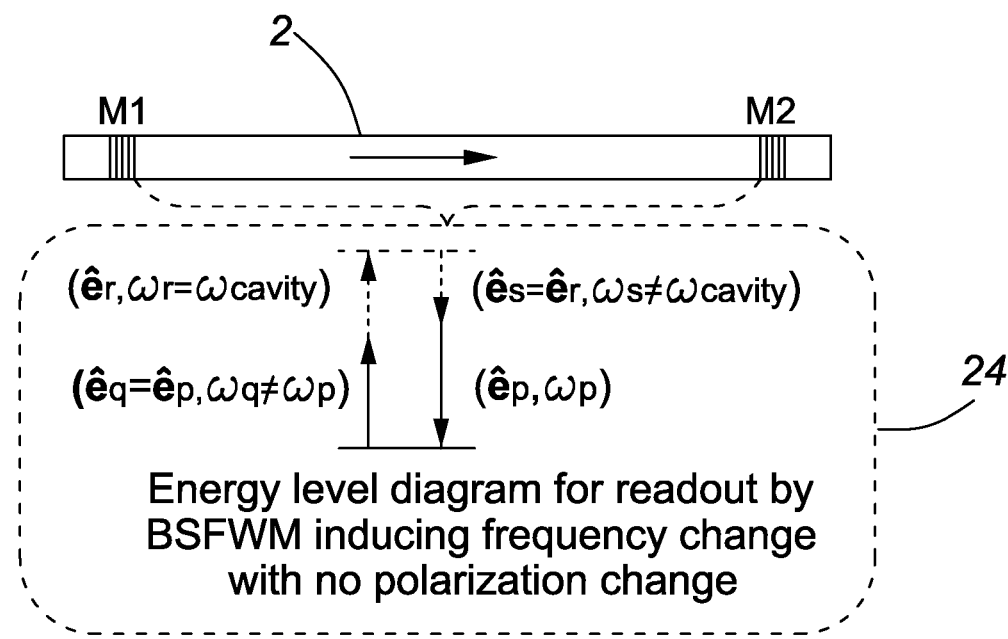

In FIG. 3e, control pulses 21 and 22 induce BS FWM to switch the frequency of the signal photon from $\omega_r$ to $\omega_s$. Energy level diagram 24 graphically shows the conditions needed for the energy conservation condition to be satisfied, so that the optical switching can proceed.

Figure 3F:

As the frequency of the signal photon has been switched back to $\omega_s$ it is no longer trapped in the cavity of the optical fibre 2. It is able to propagate through mirror M2 (or mirror M1) and exit the optical fibre 2 as shown in FIG. 3f. Similar to control pulses 15 and 16, control pulses 21 and 22 propagate through mirror M2 and also exit the optical fibre 2. The signal photon can be induced to exit the fibre in either direction, depending on which end of the optical fibre 2 the stored signal photon is propagating towards when it is switched for retrieval.

Frequency and Polarization Switching using BS FWM for Switching Light Into and Out from the Cavity FIGS. 4a to 4f describe the operation of using BS FWM as an optical frequency switch to switch the light into and out from the cavity and to trap a signal photon within an optical cavity. However, BS FWM can be used as a nonlinear optical interaction to induce not only a frequency shift, but also a change in polarization state.

FIGS. 4a to 4f describe the operation of using BS FWM as both an optical frequency switch and a polarization switch to switch the light into and out from the cavity, and to trap a signal photon within an optical cavity.

Figure 4A:
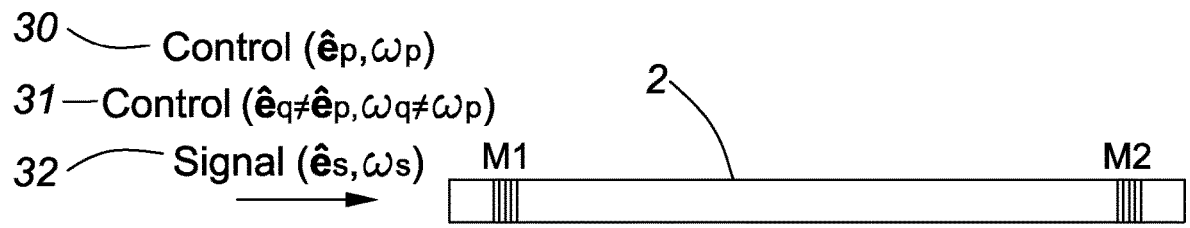
FIGS. 4a to 4f show the generation of the quantum memory based on frequency and polarization switching induced by Bragg scattering four-wave mixing in accordance with another embodiment of the present invention.

FIG. 4a shows the pulses that are input into the optical fibre. In the embodiment as shown in FIG. 4a, two bright control pulses, 30 and 31 are used, which can be, for example, bright coherent laser pulses. Control pulses 30 and 31 are centered at different frequencies to induce a frequency shift on the signal photon. Control pulse 30 is centered at frequency $\omega_p$ and control pulse 31 is centered at frequency $\omega_q$. Control pulse 30 has polarization $\hat{e}_p$ and control pulse 31 has polarization $\hat{e}_q$.

A weak input signal pulse 32 is also directed into the optical fibre. Input signal pulse 32 is centered at frequency $\omega_s$. The polarization unit vector of the weak input pulse is denoted by $\hat{e}_s$. Depending on the optical fibre, various relative polarizations between the pulses 30, 31, and 32 could be used to satisfy the energy conservation and phase matching constraints for efficient BSFWM. One example would be for the optical fibre 2 to be a birefringent fibre with a "slow" axis and a "fast" axis. The control pulse 30 would then have polarization $\hat{e}_p$ along the slow axis and the pulses 31 and 32 would have polarizations $\hat{e}_q$ and $\hat{e}_s$, respectively, along the fast axis.

As the input signal pulse 32 and the control pulses 30 and 31 are directed into optical fibre 2, the timing of the control pulses 30 and 31 is delayed with respect to the input signal pulse 32 so that the control pulses 30 and 31 will spatially and temporally overlap with the signal photon contained in the input signal pulse 32 within a region of the optical fibre 2 between the two mirrors M1 and M2. As the control pulses 30 and 31, and the input signal pulse 32 are directed into the optical fibre 2, these pulses propagate through mirror M1 and enter the optical fibre 2.

Figure 4B:
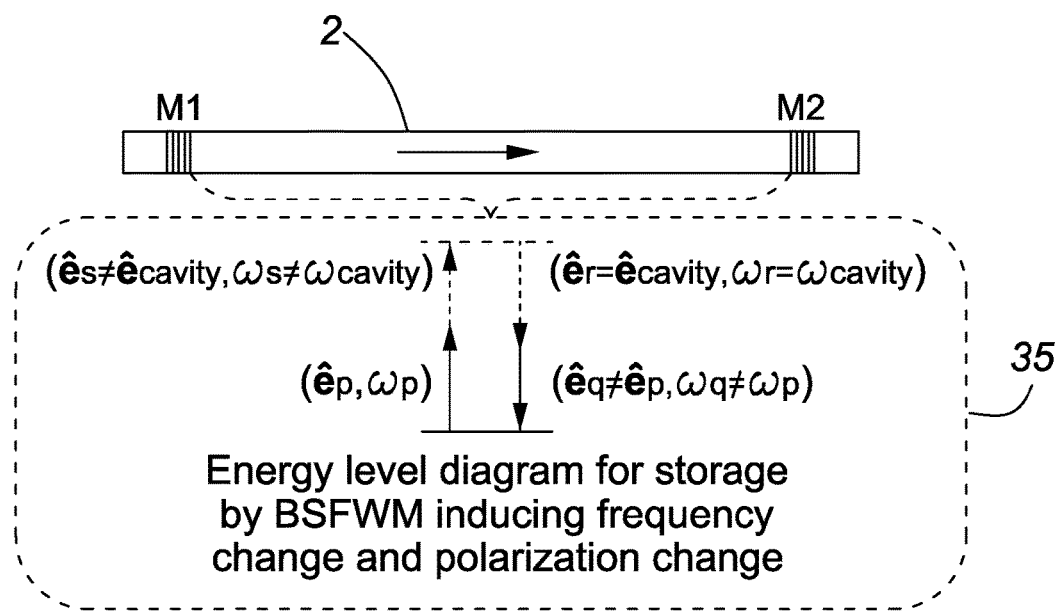

FIG. 4*b* depicts the control pulses 30, 31 and input signal pulse 32 propagating through the optical fibre 2. In the present embodiment, BS FWM is induced by the control pulses 30, 31. By using BS FWM, the single photon in the weak input signal pulse 32 is shifted by the frequency difference between the control pulses 30, 31 ($\omega_p - \omega_q$). In particular, input signal pulse 32 is up-shifted in frequency to $\omega_r = \omega_s + (\omega_p - \omega_q)$. Not only is the frequency switched, but the polarization $\hat{e}_s$ of the input signal pulse 32 is also switched by BS FWM from $\hat{e}_s \neq \hat{e}_{cavity}$ to $\hat{e}_r = \hat{e}_{cavity}$.

An energy level diagram 35 graphically shows the conditions needed for the energy conservation condition to be satisfied, so that the optical switching can proceed. On reaching mirror M2, the control pulses 30 and 31 continue to propagate out of the optical fibre 2. The frequency and polarization of the input signal pulse 32 containing the signal photon has been mapped from ($\omega_s \neq \omega_{cavity}$, $\hat{e}_s \neq \hat{e}_{cavity}$) to ($\omega_r = \omega_{cavity}$, $\hat{e}_r = \hat{e}_{cavity}$) such that on reaching mirror M2, the input signal pulse 32 is reflected back towards mirror M1. As mentioned above, the mirrors M1 and M2 have a high reflectivity for a frequency band centered at $\omega_{cavity}$ and polarization state $\hat{e}_{cavity}$. In other words, the mirrors M1 and M2 are dichroic and polarization dependent in that they reflect light with frequencies centered at $\omega_{cavity}$ and polarization $\hat{e}_{cavity}$ and transmit light with frequencies not equal to $\omega_{cavity}$ and/or polarizations not equal to $\hat{e}_{cavity}$.

Figure 4C:
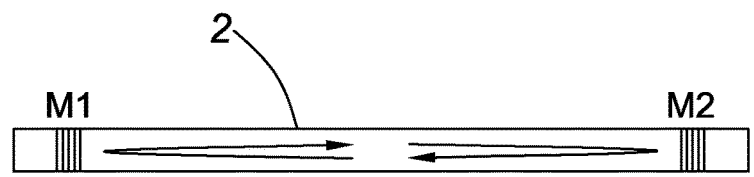

FIG. 4*c* shows that the signal photon ($\omega_r$, $\hat{e}_r$) reflects back and forth between mirrors M1 and M2 and hence is trapped inside the cavity of the optical fibre 2. As the signal photon cannot propagate through mirror M1 or M2, the signal photon can be said to be stored in the optical fibre 2, hence the creation of a storage memory for a single photon.

Figure 4D:
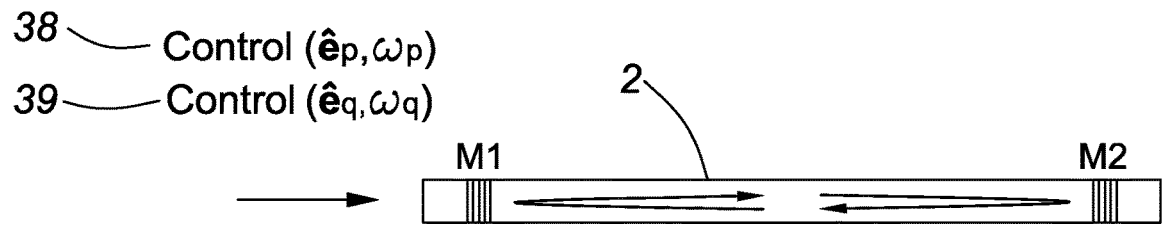

After a time delay chosen by an operator (chosen storage time), two new control pulses 38 and 39 are directed into the optical fibre 2 as shown in FIG. 4*d*. Control pulse 38 has a center frequency $\omega_p$ and control pulse 39 has a center frequency $\omega_p$. Similar to control pulses 30 and 31, control pulses 38 and 39 are timed to spatially and temporally overlap with the signal photon within a region of the optical fibre 2 between mirrors M1 and M2.

Figure 4E:
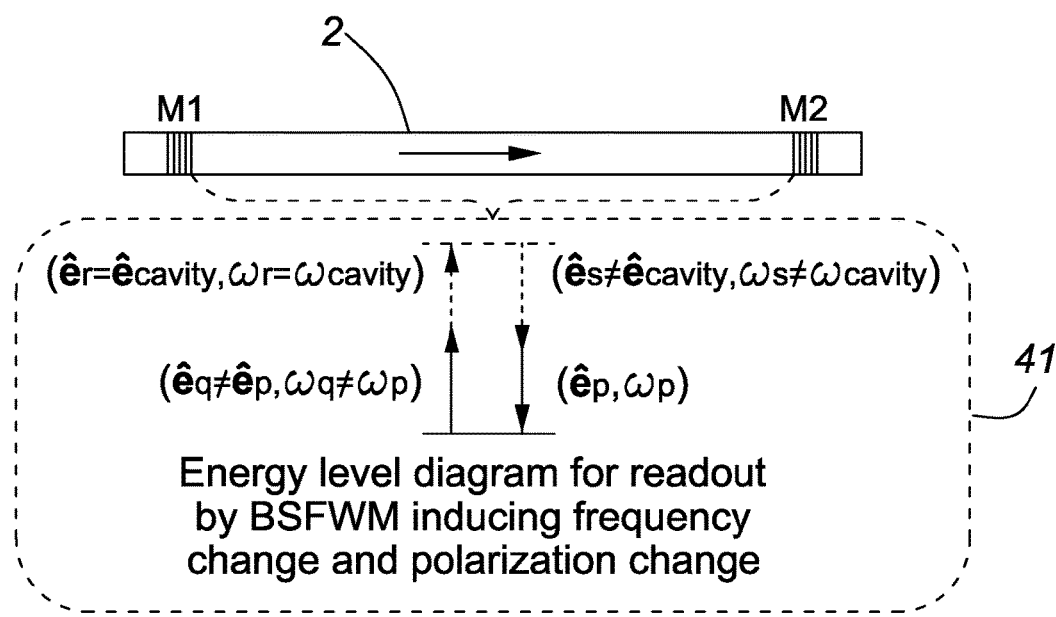

In FIG. 4*e*, control pulses 38 and 39 induce BS FWM to switch the frequency and polarization of the signal photon from ($\omega_r$, $\hat{e}_r$) to ($\omega_s$, $\hat{e}_s$). Energy level diagram 41 graphically shows the conditions needed for the energy conservation condition to be satisfied, so that the optical switching can proceed.

Figure 4F:
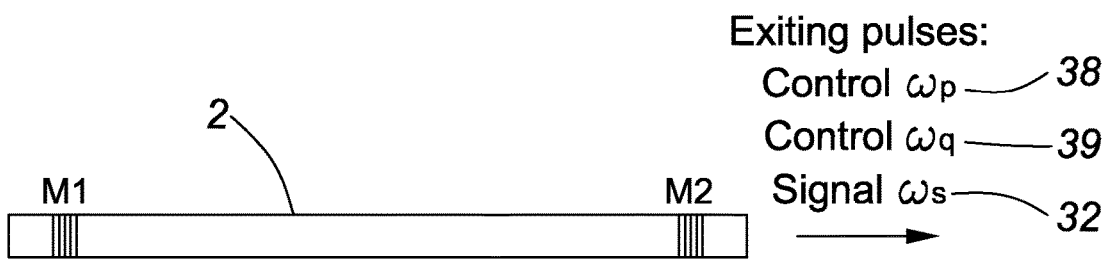

As the frequency and polarization of the signal photon has been switched back to ($\omega_s$, $\hat{e}_s$) it is no longer trapped in the cavity of the optical fibre 2. It is able to propagate through mirror M2 (or mirror M1) and exit the optical fibre 2 as shown in FIG. 4*f*. Similar to control pulses 30 and 31, control pulses 38 and 39 propagate through mirror M2 and also exit the optical fibre 2. The signal photon can be induced to exit the fibre in either direction, depending on which end of the optical fibre 2 the stored signal photon is propagating towards when it is switched for retrieval.

Frequency Switching using Cross-Phase Modulation for Switching Light Into and Out from the Cavity For cross-phase modulation (XPM) frequency switching of the signal photons, $\omega_s \cdot \omega_r$. The control pulse with frequency $\omega_p$ is chosen to have a temporal shape designed to induce the frequency shift $\omega_s$ to $\omega_r = \omega_{cavity}$ on the signal photon. The important point for the memory operation is that after the XPM interaction, the signal photon has been mapped from a frequency state that is not reflected by the cavity end mirrors, to a state that is reflected by the cavity end mirrors. XPM can subsequently be repeated to map the photon from the frequency $\omega_r = \omega_{cavity}$ back to $\omega_s \neq \omega_{cavity}$. The photon will then exit the fibre when it is transmitted by mirror M2.

FIGS. 5*a* to 5*f* describe the operation of using XPM as an optical frequency switch to switch the light into and out from the cavity and to trap a signal photon within a fibre-integrated optical cavity.

Figure 5A:
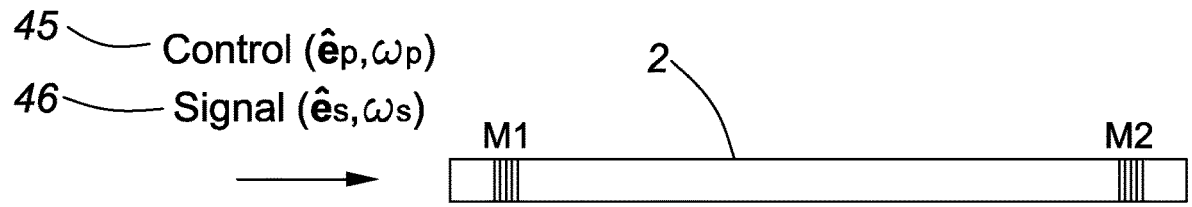
FIGS. 5a to 5f show the generation of the quantum memory based on frequency switching induced by cross-phase modulation in accordance with another embodiment of the present invention.

FIG. 5*a* shows the pulses that are input into the optical fibre. To trap the photon in the optical fibre cavity, it is proposed to use optical switching using bright control laser pulses. In the embodiment as shown in FIG. 5*a*, one control pulse, 45 is used. Control pulse 45 is a coherent laser pulse and its temporal intensity profile is designed to induce a frequency shift on the signal photon, but not a change of polarization. Control pulse 45 is centered at frequency $\omega_p$. The control pulse 45 could be at wavelengths of anything from 400 nm (749 THz) to 3000 nm (99.9 THz), but the most likely range is from 700 nm (428 THz) to 2000 nm (149.9 THz). A weak input signal pulse 46 is also directed into the optical fibre. The weak input signal pulse is defined as a quantum state of light where the most common realization will be a signal pulse comprising a single photon. Input signal pulse 46 is centered at frequency $\omega_s$. For the frequency band centered at the frequency $\omega_{cavity}$ at which the optical fibre cavity 2 can trap light, the mirrors M1 and M2 will have high reflectivity. The reflectivity will be as high as possible (e.g. from 95% to 100%) at the cavity frequency $\omega_{cavity}$. Conversely, the reflectivity will be as low as possible for the other optical frequencies involved (e.g. zero as close as is practically possible). In practice, it will be a reflectivity of 1 to 10%.

Returning to FIG. 5*a*, as the input signal pulse 46 and the control pulse 45 are directed into optical fibre 2. The timing of the control pulse 45 is delayed with respect to the input signal pulse 46 so that the control pulse 45 will spatially and temporally overlap with the input signal pulse 46 within a region of the optical fibre 2 between the two mirrors M1 and M2. As the control pulse 45, and the input signal pulse 46 are directed into the optical fibre 2, these pulses propagate through mirror M1 and enter the optical fibre 2 because the mirror M1 has low reflectivity at frequencies $\omega_p$ and $\omega_s$.

Figure 5B:
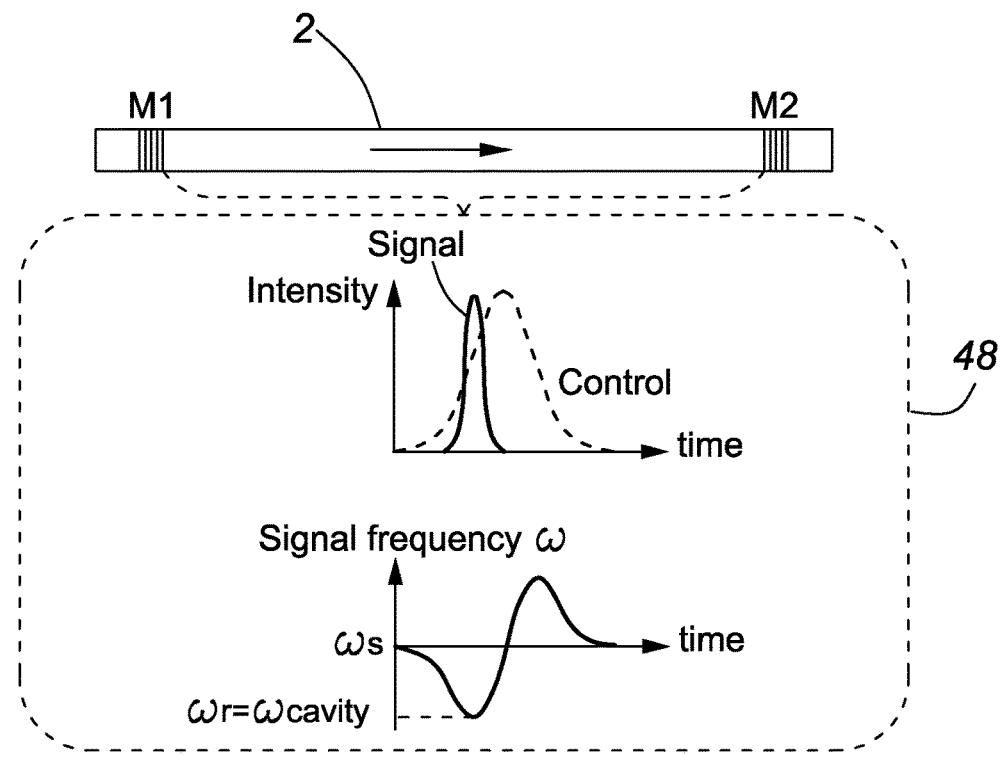
Figure 5C:
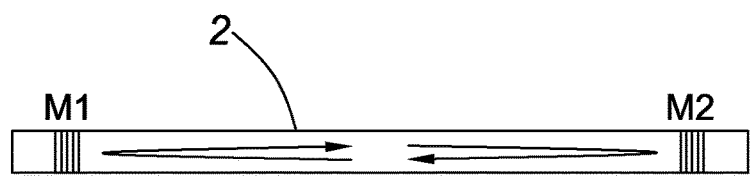

XPM is a nonlinear optical process in which two distinct pulses of light each generate an optical phase shift on the other pulse, with the size of the optical phase shift being determined by the intensity of the pulse generating the phase shift [A. M Weiner, "Ultrafast Optics", John Wiley & Sons Inc. (2009); N. Matsuda "Deterministic reshaping of single-photon spectra using cross-phase modulation" *Science Advances* 2 e1501223 (2016) (DOI: 10.1126/sciadv.1501223)]. FIG. 5*b* depicts the control pulse and signal pulse propagating through the optical fibre 2. The schematic viewgraphs 48 show the relative timing delay of the normalized intensity of the signal pulse relative to the normalized intensity of the control pulse, such that the intensity of the control pulse is increasing as a function of time across the temporal profile of the signal pulse when the two pulses propagate towards mirror M2. As a result of the increasing intensity of the control pulse, the size of the phase shift induced on the signal pulse by XPM is increasing as a function of time. This time-varying phase shift induced on the signal pulse results in a frequency shift of the signal pulse, shifting it from $\omega_s \neq \omega_{cavity}$ to $\omega_r = \omega_{cavity}$, as shown in the signal frequency viewgraph 48. As a result of this XPM-induced frequency shift, the signal photon will be reflected when it reaches mirror M2, while the control pulse with frequency $\omega_p \neq \omega_{cavity}$ will be transmitted when it reaches mirror M2 and exits the fibre. The signal photon is now trapped, or stored, in the fibre cavity 2 as shown in FIG. 5c.

Figure 5D:
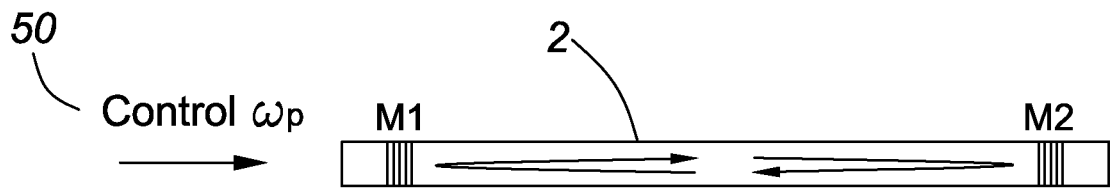

After a time delay chosen by an operator (chosen storage time), a new control pulse 50 is directed into the optical fibre 2 as shown in FIG. 5d. Control pulse 50 has a center frequency $\omega_p \neq \omega_{cavity}$ such that it is transmitted by mirror M1. Similar to control pulse 45, control pulse 50 is timed to spatially and temporally overlap with the signal photon within a region of the optical fibre 2 between mirrors M1 and M2.

Figure 5E:
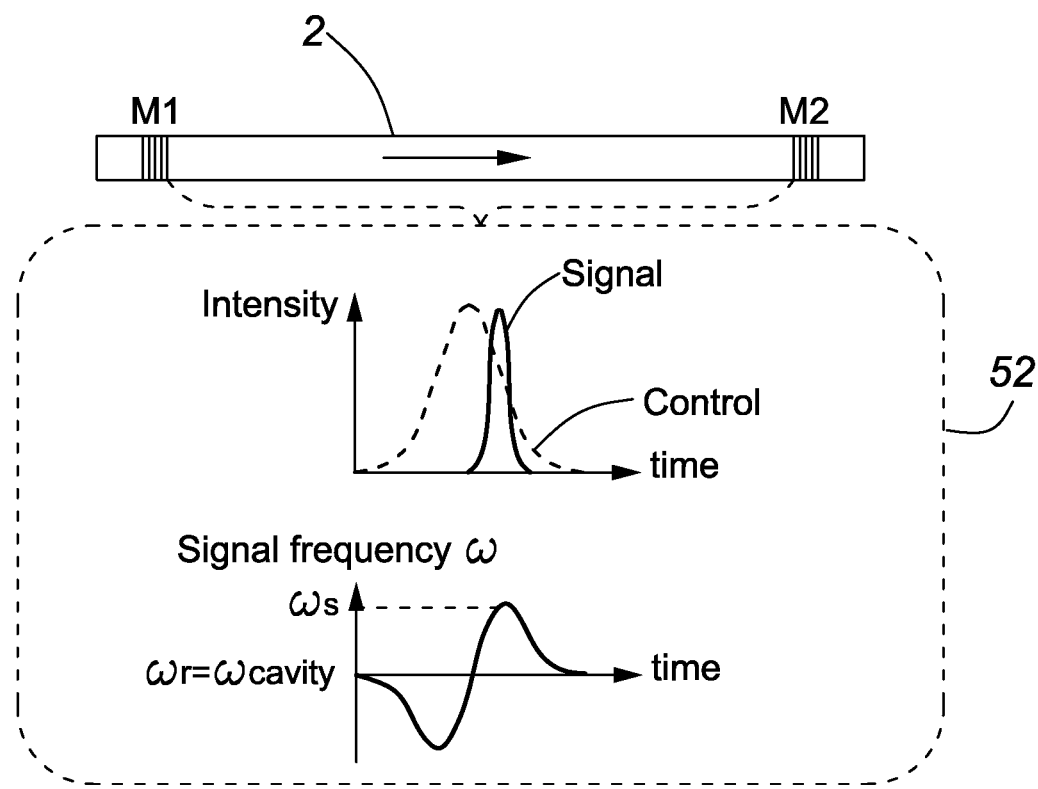

FIG. 5e depicts the control pulse and signal pulse propagating through the optical fibre 2. The schematic viewgraphs 52 show the relative timing delay of the normalized intensity of the signal pulse relative to the normalized intensity of the control pulse, such that the intensity of the control pulse is decreasing as a function of time across the temporal profile of the signal pulse when the two pulses propagate towards mirror M2. As a result of the decreasing intensity of the control pulse, the size of the phase shift induced on the signal pulse is decreasing as a function of time. This time-varying phase shift induced on the signal pulse results in a frequency shift of the signal pulse, shifting it from $\omega_r = \omega_{cavity}$ to $\omega_s \neq \omega_{cavity}$, as shown in the viewgraph 52. As a result of this XPM-induced frequency shift, the signal photon will be transmitted when it reaches mirror M2 and exits the fibre.

Figure 5F:

FIG. 5f shows the signal pulse 46 and the control pulse 50 exiting the fibre after transmission through mirror M2, completing this embodiment of the disclosure.

It is noted here that the signal photon can be induced to exit the fibre in either direction, depending on which end of the optical fibre 2 the stored signal photon is propagating towards when it is switched for retrieval. In the described realization XPM was used to induce a frequency down-shift to trap the signal photon, FIG. 5b, followed by a frequency up-shift to release the signal photon, FIG. 5e. Depending on the properties of the user-designed mirrors M1 and M2, it may be preferred to induce a frequency up-shift to trap the signal photon, followed by a frequency down-shift to release the signal photon.

Cross-Phase Modulation for Transiently Shifting the Reflection Frequency of the Cavity End Mirrors to Switch Light Into and Out from the Cavity It has previously been demonstrated that cross-phase modulation induced by an intense laser pulse can be used to transiently shift the reflection frequency of a Bragg grating inscribed in an optical fibre [S. Larochelle et al., "All-optical switching of grating transmission using cross-phase modulation in optical fibers," *Electron. Lett.* 26, 1459-1460 (1990); Kabakova et al., "Bragg grating-based optical switching in a bismuth-oxide fiber with strong $\chi^{(3)}$-nonlinearity" *Optics Express* 19, 5868 (2011)]. The size of the frequency shift induced is proportional to the peak power of the intense laser pulse.

In the other embodiments of the invention described herein, we propose using nonlinear optical optical methods to modify the frequency and/or polarization properties of the signal photon such that it can be switched into and out of the fibre-integrated cavity. In this section, we describe an embodiment in which a nonlinear optical method, XPM, is used to transiently modify the reflection frequency of the of the cavity end mirrors, such that the signal photon can be switched in and out of the fibre-integrated cavity.

Figure 6A:
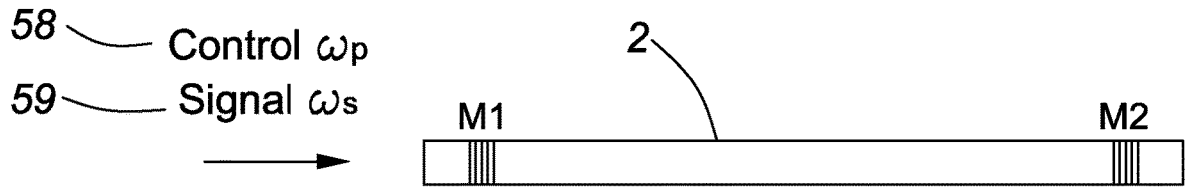
FIGS. 6a to 6f show the generation of the quantum memory based on transiently switching the reflective frequency of the cavity reflective elements ("mirrors") in accordance with another embodiment of the present invention.
Figure 6B:
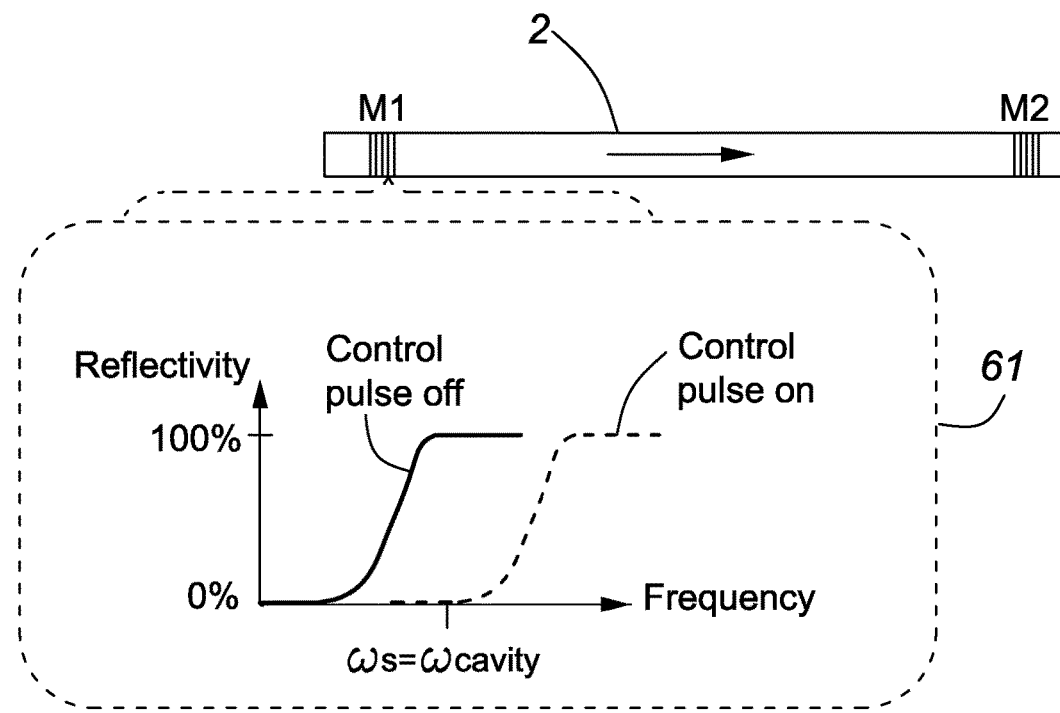

FIG. 6a shows the pulses that are input to the optical fibre cavity 2. To trap the photon in the optical fibre cavity, it is proposed to use optical switching of the cavity end mirror reflectance using a control pulse 58. In the embodiment as shown in FIG. 6a, one control pulse, 58 is used. Control pulse 58 is a coherent laser pulse and its temporal intensity profile is designed to induce a frequency shift in the reflectance wavelength. Control pulse 58 is centered at frequency $\omega_p$. The control pulse 58 could be at wavelengths of anything from 400 nm (749 THz) to 3000 nm (99.9 THz), but the most likely range is from 700 nm (428 THz) to 2000 nm (149.9 THz). A weak input signal pulse 59 is also directed into the optical fibre. The weak input signal pulse is defined as a quantum state of light where the most common realization will be a signal pulse comprising a single photon. Input signal pulse 59 is centered at frequency $\omega_s$. For the frequency band centered at the frequency $\omega_{cavity}$ at which the optical fibre cavity 2 can trap light, the mirrors M1 and M2 will have high reflectivity. The reflectivity will be as high as possible (e.g. from 95% to 100%) at the cavity frequency $\omega_{cavity}$. At a frequency close to, but not equal to, $\omega_{cavity}$, the mirrors M1 and M2 will have low reflectivity, as shown in FIG. 6b, 61. In this embodiment, $\omega_s = \omega_{cavity}$, so that in the absence of the control pulse 58, the signal pulse would be reflected by mirror M1 and would not propagate into the fibre cavity.

Figure 6C:
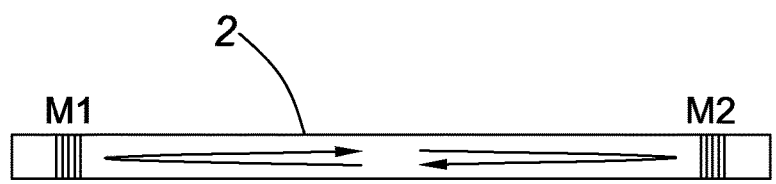

FIG. 6b shows the effect 61 of the control pulse 58 on the cavity end mirror M1. When the control pulse is on, so that it temporally and spatially overlaps with the signal 59 when the signal 59 is interacting with the mirror M1, the spectral region of high reflectivity is up-shifted away from the frequency $\omega_s = \omega_{cavity}$, such that the signal pulse is transmitted by mirror M1 and is able to propagate towards mirror M2. The fibre cavity must be designed such that the signal pulse 59 and control pulse 58 are no longer temporally overlapped when the signal pulse 59 reaches mirror M2, such that the signal pulse is reflected by mirror M2 and is now trapped, or stored, within the fibre cavity 2, as shown in FIG. 6c. The fibre cavity can incorporate this design by, for example, using group velocity dispersion inherent to the fibre, which means that the signal pulse 59 and control pulse 58 will travel at different speeds in the fibre so that they are not overlapped at M2, despite being overlapped at mirror M1. Alternatively, it may be possible to introduce a third cavity reflective element, such as a Fibre Bragg Grating that reflects light at the control pulse frequency $\omega_p$, but transmits the signal pulse frequency $\omega_s$ between mirrors M1 and M2. In this way, the control pulse would be reflected back out of the fibre before reaching mirror M2.

Figure 6D:
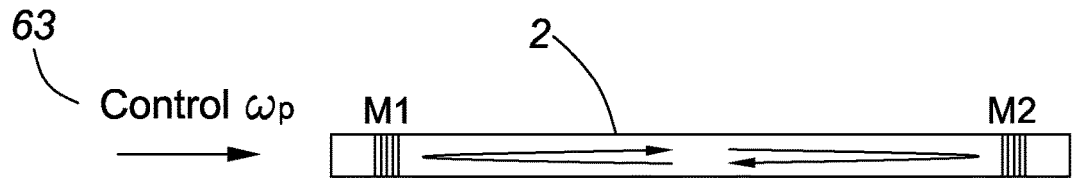

After a time delay chosen by an operator (chosen storage time), a new control pulse 63 is directed into the optical fibre 2 as shown in FIG. 6d. Control pulse 63 has a center frequency $\omega_p \neq \omega_{cavity}$ such that it is transmitted by mirror M1. Control pulse 63 is timed to spatially and temporally overlap with the signal pulse when the signal is interacting with mirror M2.

Figure 6E:
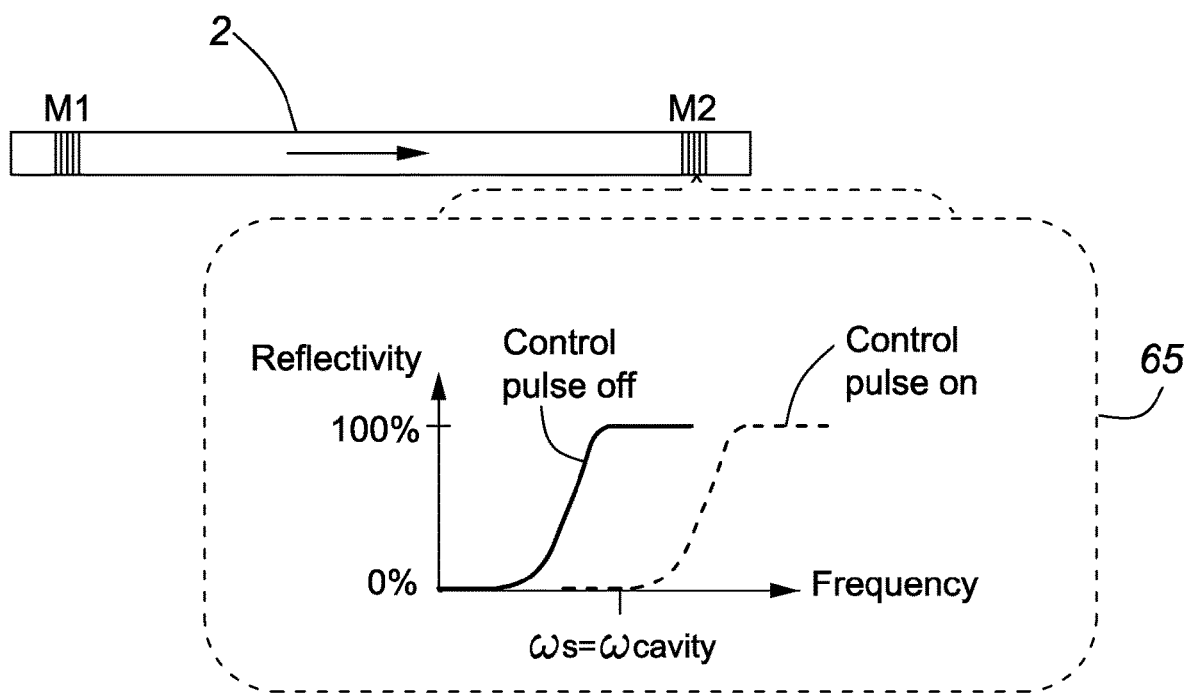

FIG. 6e shows the effect 65 of the control pulse 63 on the cavity end mirror M2. When the control pulse is on, so that it temporally and spatially overlaps with the signal 59 when the signal 59 is interacting with the mirror M2, the spectral region of high reflectivity is up-shifted away from the frequency $\omega_s = \omega_{cavity}$ by XPM, such that the signal pulse is transmitted by mirror M2 and is able to exit the fibre.

Figure 6F:

FIG. 6f shows the final state of the memory, with the control pulse 63 and the signal pulse 59, exiting the fibre, so that the signal pulse is available for use.

Protocol for Operating the Invention as a Source of Single Photons

In the other embodiments of the invention, a signal pulse is directed into the memory and stored temporarily before later being released. For example, the signal pulse might be a single photon from a probabilistic photon pair source that is external to the fibre cavity. The ability to temporarily store a photon from a probabilistic photon pair source is a useful function of the proposed invention, because it is possible to operate the composite system of a probabilistic photon pair source and the proposed invention together to deliver single photons "on demand", or at least "pseudodemand" with a much greater probability of success. This would be an example of using the quantum memory to temporally multiplex a probabilistic photon pair source ["Single photons on pseudodemand from stored parametric down-conversion", T. B. Pittman et al. *Physical Review A* 66 042303 (2002); "High-efficiency single-photon generation via large-scale active time multiplexing", F. Kaneda and P. G. Kwiat *Science Advances* 5 eaaw8586 (2019)]. For example, an external probabilistic photon pair source would be repeatedly operated multiple times until a daughter "herald" photon from the probabilistic photon pair source is detected, heralding that a second daughter photon, the "signal" photon has also been created. At this point, the probabilistic photon pair source would not be operated, or "pumped" again. The signal photon would be directed into the fibre-integrated quantum memory and stored temporarily, before later release at a specified readout time. Importantly, the regular time period between the pulses pumping the external probabilistic photon pair source would be matched to an integer multiple of the time period taken by a stored signal photon to complete one round-trip cycle in the cavity.

As a result of this time-period matching, a signal photon created in any of the operation cycles of the probabilistic photon pair source can be released from the quantum memory at a later specified readout time. Thus, the probability of releasing a signal photon at the specified readout time is significantly improved by the addition of the quantum memory, compared with operating a heralded photon pair source on its own.

It is a specific feature and advantage of the present invention that in some embodiments it will be possible to optically "pump" the fibre in the fibre-integrated quantum memory such that photon pairs are created in the fibre by spontaneous four-wave mixing, with one of the photons, the "signal" photon, trapped within the cavity while the other "herald" photon exits the fibre. This property means that the probabilistic photon pair source is effectively integrated within the fibre quantum memory and so the whole device can be operated as a single photon source with a high probability of generating a single photon when required. The integration of the photon source within the fibre memory is a significant technical advantage relative to operating the photon source external to the fibre memory because it reduces the probability that the signal photon will be scattered or absorbed or otherwise lost before it can be stored in the memory. As with the other embodiments of the invention, the use of optical fibre is an advantage over other technologies because the invention can easily be integrated with fibre optical networks. Furthermore, optical fibre components are a mature technology and it is a specific advantage to be able to use these in composite devices that use the present invention.

Figure 7A:
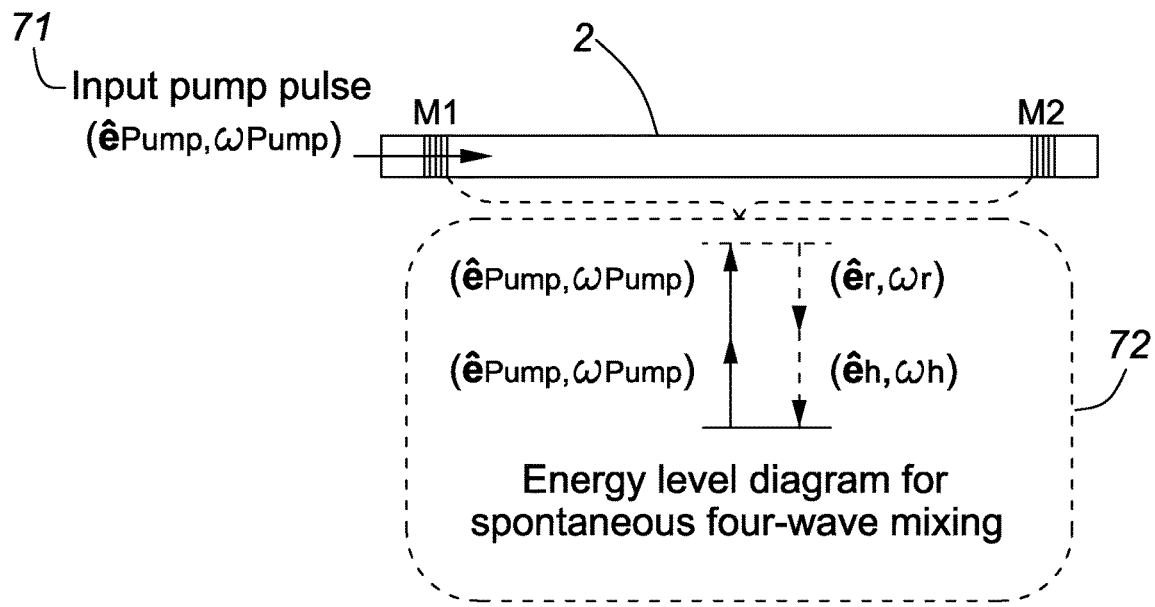
FIGS. 7a to 7c show the quantum memory operating with an integrated photon pair source such that the memory acts as a deterministic, or near-deterministic, source of photons.
Figure 7B:
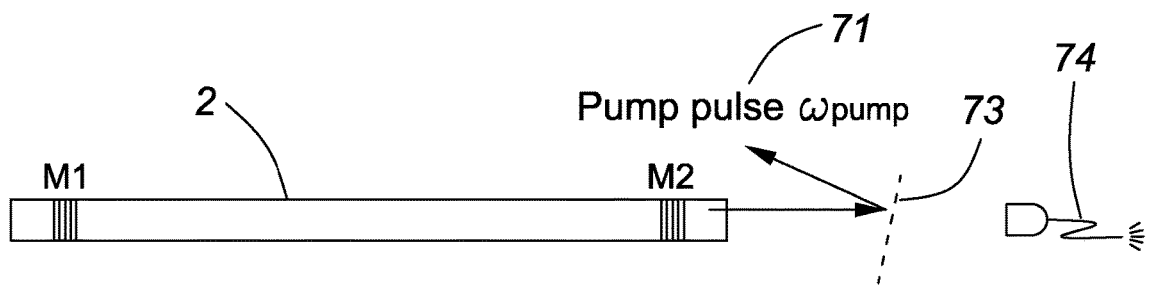
Figure 7C:
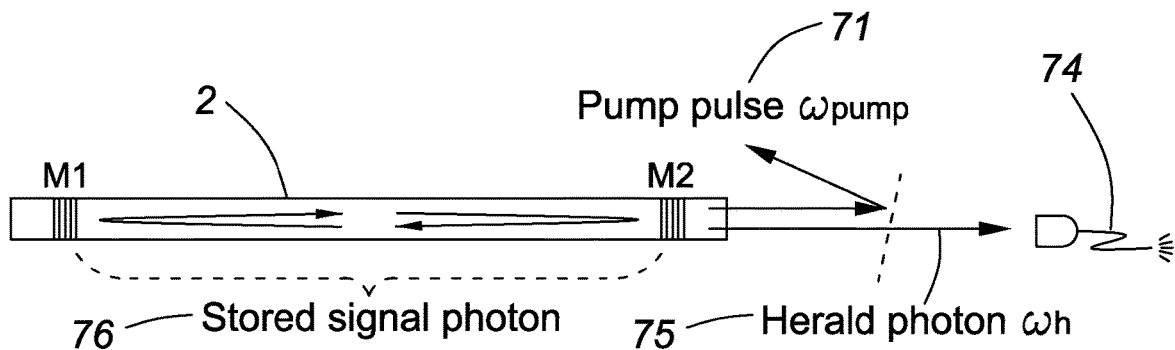

FIG. 7a-c shows the operating principles that would be used in such an embodiment of the invention.

FIG. 7a shows a bright coherent laser "pump" pulse 71 with frequency $\omega_{pump}$ and polarization ê pump entering the optical fibre 2. The mirrors M1 and M2 have been designed to transmit light with frequency $\omega_{pump}$ and polarization $\hat{e}_{pump}$, such that the pump pulse 71 will eventually exit the fibre 2. An energy level diagram 72 shows that during the propagation of the pump pulse 71 between M1 and M2, there is a possibility that spontaneous four-wave mixing (SFWM) will result in the annihilation of two of the pump photons and the creation of two daughter photons. The two daughter photons are referred to as the signal photon with frequency $\omega_r$ and polarization $\hat{e}_r$ and the herald photon with frequency $\omega_h$ and polarization $\hat{e}_h$. It is a property of SFWM, known to those skilled in the art, that the relative frequencies of the pump photons, signal photon, and herald photon are determined by the requirements of energy conservation and momentum conservation [O. Cohen et al. "Tailored Photon-Pair Generation in Optical Fibers", *Physical Review Letters* 102, 123603 (2009)], with momentum conservation determined by the dispersive properties of the optical fibre 2. The mirrors M1 and M2 must be designed to transmit light with frequency $\omega_h$ and polarization $\hat{e}_h$ and to reflect light with frequency $\omega_r$ and polarization $\hat{e}_r$.

FIG. 7b shows the pump pulse 71 exiting the fibre 2 after transmission by M2 and being rejected by an optical filter 73. A photon pair has not been created and so the single-photon detector 74 does not register a detection event. Since there has not been a successful detection event, a new pump pulse must be propagated into the fibre 2 as shown in FIG. 7a to try again to generate a photon pair by SFWM. This cycle will be repeated until a photon pair is created in a "repeat-until-success" strategy. It is an important operating principle that the relative time delay between each adjacent pump pulse introduced to the fibre will be equal to or nearly equal to an integer multiple of the cavity round-trip time that would be taken for a photon with frequency $\omega_r$ circulating in the cavity between M1 and M2. In this way, when a signal photon is eventually created, it will not matter from which pump pulse the signal is generated.

FIG. 7c shows the pump pulse 71 exiting the fibre 2 after transmission by mirror M2 and being rejected by the optical filter 73. A photon pair has been created by SFWM according to the energy level diagram in FIG. 7a. A herald photon 75 with frequency $\omega_h$ and polarization $\hat{e}_h$ has been transmitted by both the mirror M2 and by the optical filter 71, before being detected by the single-photon detector 74 which generates an electrical signal. The electrical signal generated by the herald photon 75 is used to trigger a switch so that no further pump pulses are propagated into the optical fibre 2. For example, this switch could be an electro-optic switch or an acousto-optic switch, or any other electrically triggered optical switch known to those skilled in the art. A signal photon 76 with frequency $\omega_r$ and polarization $\hat{e}_r$ has been reflected by mirror M2 and is now stored in the cavity. The state of the fibre memory is now equivalent to that described in any of FIG. 2c, 3c, 4c, 5c, or 6c; that is, a single signal photon circulating in the fibre cavity. The signal photon 76 can thus be read out from the fibre memory using one of the techniques disclosed herein, including polarization switching by the optical Kerr effect; frequency switching by Bragg scattering four-wave mixing; frequency and polarization switching by Bragg scattering four-wave mixing; frequency switching of the signal photon by cross-phase modulation; or, transient frequency switching of the cavity end mirror reflectivity by cross-phase modulation.

Finally, it is disclosed that while the quantum memory with an integrated photon source is primarily envisioned as a source of single photons, that is Fock states with photon number N=1, the invention could also be used to generate Fock states with photon numbers N>1. This could be done with some simple modifications to the sequence describing FIG. 7a-c. For example, in order to generate a Fock state with N=2, instead of triggering a switch to stop pump pulses propagating into the fibre immediately after detection of a single herald photon generated by SFWM, the device would continue to propagate pump pulses into the fibre until two herald photons generated by SFWM have been detected at the exit of the fibre. When two herald photons have been detected, either generated from a one pump pulse or from two separate pump pulses, it would herald that a Fock state with photon number N=2 is circulating in the fibre cavity. This signal pulse with photon number N=2 could subsequently be retrieved from the fibre-integrated cavity using one of the optical switching techniques disclosed herein. In order to operate such an embodiment of the invention, the single photon detector 74 in FIGS. 7b and 7c would have to be replaced with a photon-number-resolving detector that would be obvious to one skilled in the art, such as a transition edge sensor or a superconducting-nanowire photon detector.

Experimental Results

FBGs as Reflective Elements

Figure 8:
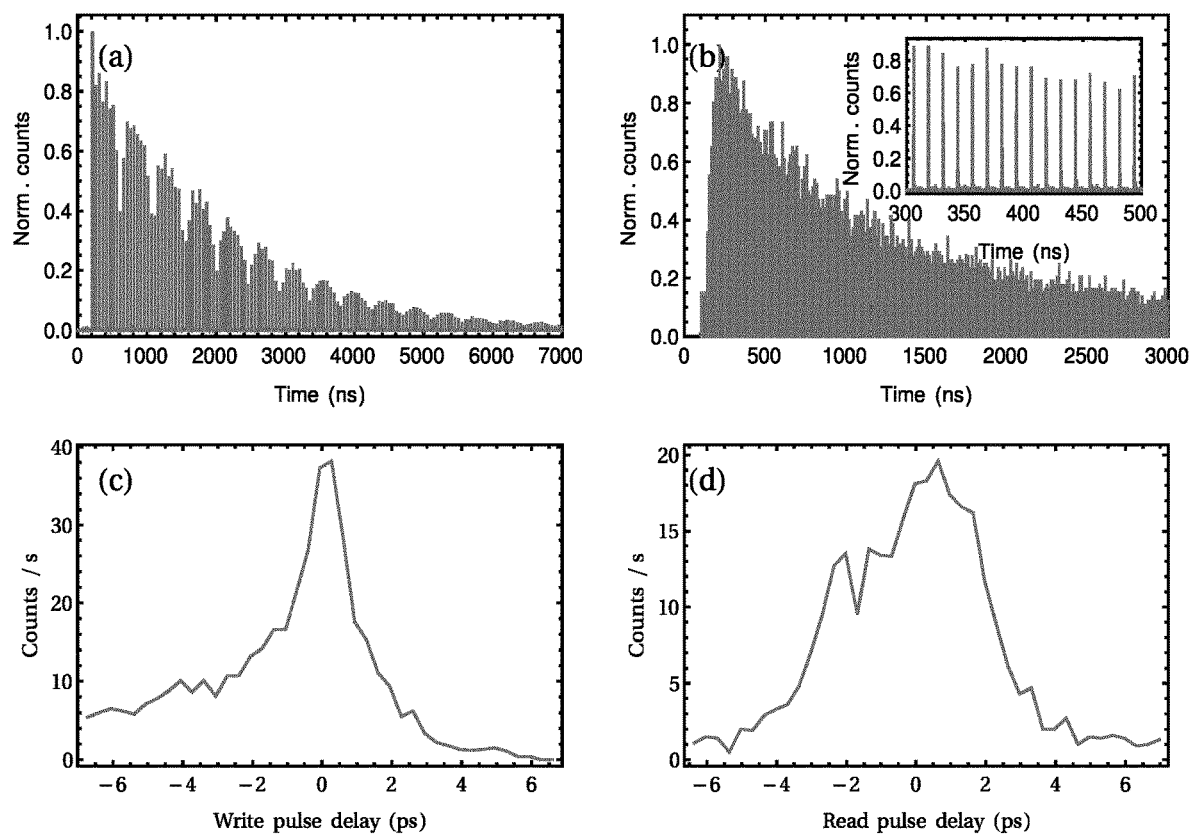
FIGS. 8a to 8d show experimental results using fibre Bragg gratings (FBGs) as the reflective elements within the optical fibre.

Initial results from Fibre Bragg Grating (FBG) memory experiments are shown in FIG. 8. FIG. 8a shows a ringdown measurement in a 5 m cavity made in Nufern 1060XP fibre. Light which is maximally reflected by the FBGs (here, 1547 nm) is injected into the cavity. Photons leaking out of the cavity are measured on a fast photon detector after each round trip. In this sample, a round trip takes ~50 ns. Photon counts exponentially decay for more round trips (periodic dips in the photon counts are due to the detector dead time) and a 1/e cavity lifetime of 2 µs, or 40 round trips is extracted. FIG. 8b shows a ringdown measurement performed on an FBG cavity made in HB1500 polarization-maintaining fibre. Here, the cavity lifetime is 2 µs, or 160 round trips. While this fibre cavity shows promise, conversion of photons into, and out of, the resonant cavity wavelength has not yet been tested. FIGS. 8c and 8d show initial results of memory operation in the 5 m Nufern 1060XP cavity. During the write step, pump pulses at 1323 nm and 1342 nm map signal light into the memory by Bragg scattering four-wave mixing, converting the wavelength of the input signal (1571 nm) to the stored signal wavelength of 1547 nm. FIG. 8c shows the measured photon counts at 1547 nm leaking out of the cavity, which peaks when the write pulses are overlap with the input signal in time. Similarly, the read process, which occurs 50 ns later, maps the stored light back to 1571 nm. The peak in FIG. 8d results from the read pulses overlapping in time with the 1547 nm stored signal in the cavity. Currently, the overall memory efficiency is less than 1%.

Dielectric Stacks as Reflective Elements

Figure 9:
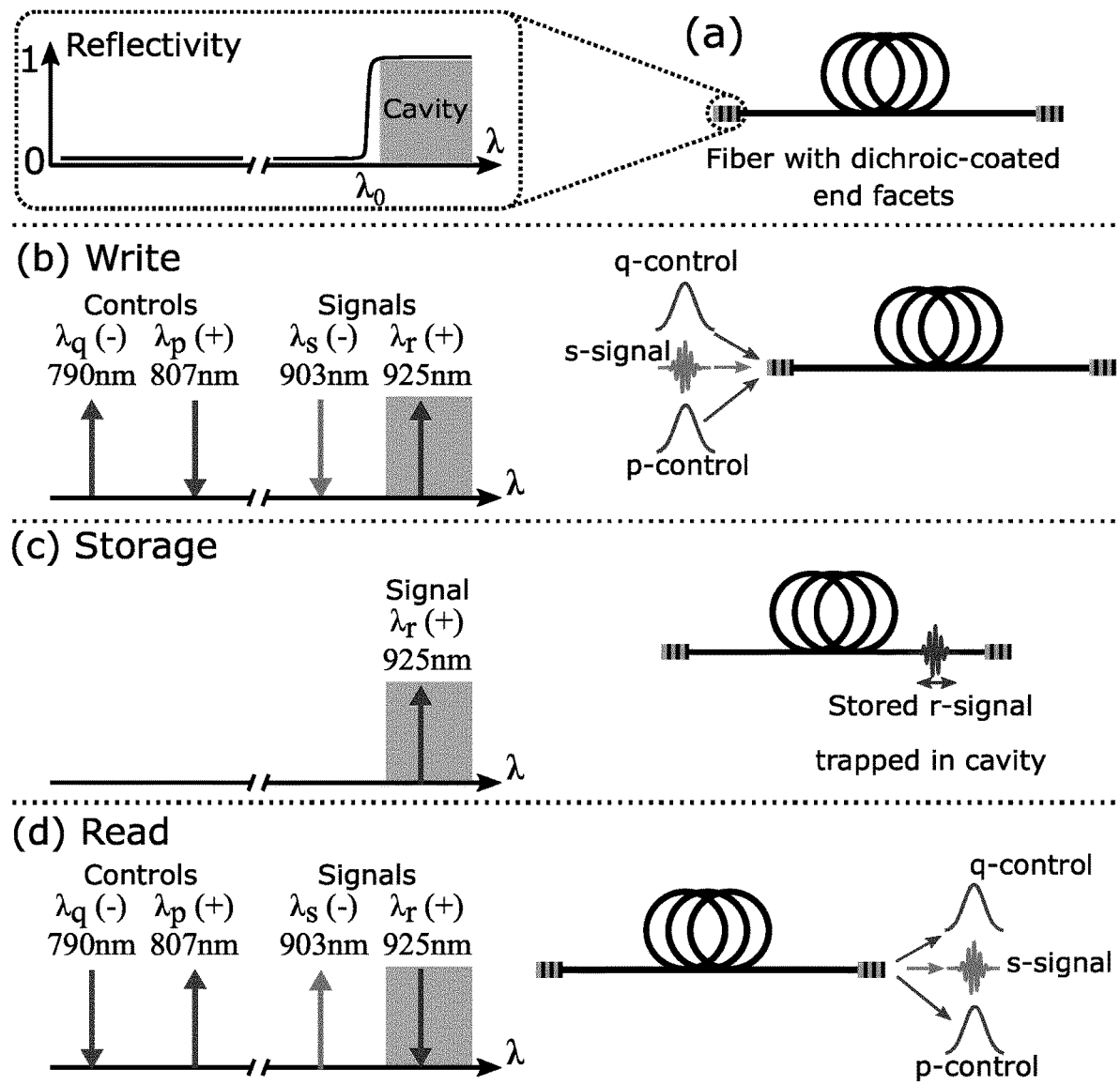
FIGS. 9 to 13 show experimental results using a dichroic dielectric stack as the reflective elements within the optical fibre.

The following proposes and demonstrates a quantum memory for light based on fiber-cavity-storage with intra-cavity frequency translation (FC-SWIFT). The fiber is a linear cavity, with the two end facets each coated with a short-wave-pass dichroic dielectric stack. FIG. 9a shows a fiber cavity, with dichroic-coated end facets. The fiber forms a cavity for wavelengths $\lambda > \lambda_0$ (gray region of reflectivity plot). FIG. 9b shows the write-step: intense control pulses at $\lambda_p$ on the slow axis (+) and $\lambda_q$ on the fast axis (−) red-shift the input signal photon from $\lambda_s$ to $\lambda_r$. FIG. 9c shows the storage period: the signal photon at $\lambda_r > \lambda_0$ is trapped in the cavity. FIG. 9d shows the read-step: intense control pulses at wavelengths $\lambda_p$ and $\lambda_q$ blue-shift the trapped signal photon from $\lambda_r$ to $\lambda_s$. As shown in FIG. 9a, for wavelengths $\lambda > \lambda_0$ the end facets have high reflectivity; for wavelengths $\lambda < \lambda_0$ light can enter and exit the fiber with high transmission. In the write step, as shown in FIG. 9b, the signal photon with wavelength $\lambda_s < \lambda_0$ is input to the fiber with two intense ancillary control pulses at wavelengths $\lambda_q$ and $\lambda_p$. The control pulses red-shift the signal pulse from $\lambda_s$ to $\lambda_r > \lambda_0$ by BSFWM. As a result, the signal photon is reflected with high probability when it reaches the fiber end facet and is thus trapped within the fiber cavity. During the storage stage, as shown in FIG. 9c, the signal photon continues to propagate back and forth within the fiber cavity. Finally in the read step, as shown in FIG. 9d, intense control pulses at wavelengths λq and λp propagate into the fiber timed to overlap with the circulating signal pulse. The signal photon is frequency-translated from $\lambda_r$ to $\lambda_s$ by BSFWM such that it exits the fiber when it reaches the fiber end facet.

Use of a bespoke fiber cavity offers several features that are complementary to those of alternative memory designs. Cavities can be designed across a wide spectral range from the visible to the infrared, and broad bandwidths ca be accommodated. In the case of a fiber cavity, integrated mirrors may minimize losses arising from multiple surface reflections in a free-space cavity and improve scalability with a smaller cavity footprint. The spatial mode of a fiber cavity will be well-suited to operation with other composite fiber technologies. Indeed, integration of a fiber-based photon source (see B. J. Smith, P. Mahou, O. Cohen, J. S. Lundeen, and I. A. Walmsley, "Photon pair generation in birefringent optical fibers", Opt. Express 17, 23589 (2009)) within a FC-SWIFT-memory would reduce losses and equipment footprint, allowing efficient temporal multiplexing (see T. B. Pittman, B. C. Jacobs, and J. D. Franson, "Single photons on pseudodemand from stored parametric down-conversion", Phys. Rev. A 66, 042303 (2002), as well as A. L. Migdall, D. Branning, and S. Castelletto, "Tailoring single-photon and multiphoton probabilities of a single-photon on-demand source", Phys. Rev. A 66, 053805 (2002).

As a demonstration of the FC-SWIFT memory, a fiber cavity was fabricated in a polarization-maintaining (PM) fiber (Fibercore HB800). Birefringent PM fiber has been shown to offer the possibility of high-efficiency, unidirectional frequency translation by BSFWM, with favorable phase-matching conditions for broadband signal pulses (see J. B. Christensen, J. G. Koefoed, B. A. Bell, C. J. McKinstrie, and K. Rottwitt, "Shape-preserving and unidirectional frequency conversion by four-wave mixing", Opt. Express 26, 17145 (2018)). Phase matching is achieved for unidirectional frequency translation with the control pulses launched on the two orthogonal polarization axes. In a fiber with normal dispersion, for appropriate control frequency separation the signal is frequency down-shifted by BSFWM when launched on the fast (−) axis, according to $\omega_r = \omega_s - (\omega_q - \omega_p)$, where $\omega_i = 2\pi c / \lambda_i$ (J. B. Christensen, J. G. Koefoed, B. A. Bell, C. J. McKinstrie, and K. Rottwitt, "Shape-preserving and unidirectional frequency conversion by four-wave mixing", Opt. Express 26, 17145 (2018)). FIGS. 10a and 10b show the coating transmission T measured on a blank substrate during the coating run (Omega Optical). The coating was designed to yield high transmission for the control pulses at $\lambda_q = 790.1$ nm and $\lambda_p = 807.4$ nm, and for the input signal pulses at $\lambda_s = 902.5$ nm; at wavelengths $\lambda > 920$ nm the coating has high reflectivity to form a cavity, including the storage wavelength $\lambda_r = 925$ nm.

Figure 10:
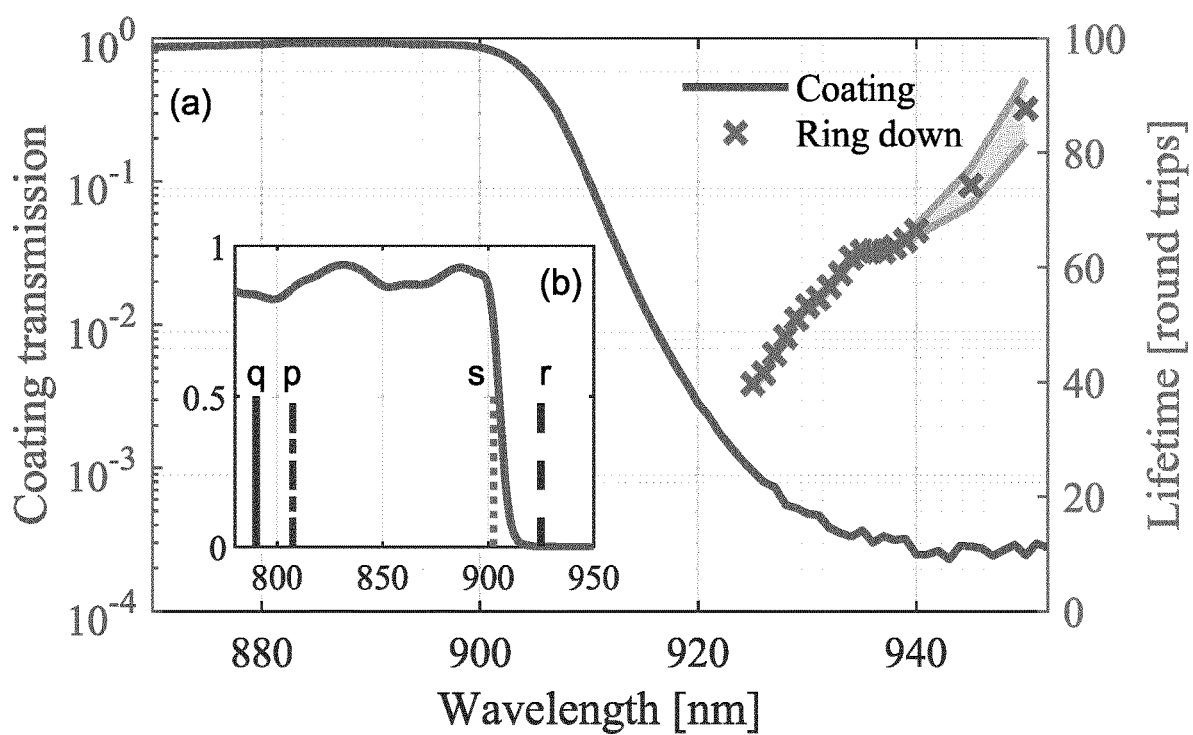

The cavity lifetime as a function of wavelength using a ring-down procedure. Bright signal pulses (around $\geq 10^5$ photons/pulse) with a full-width at half-maximum (FWHM) bandwidth of $\approx 1$ nm were coupled into the 1.285-m end-facet-coated (EFC) PM fiber, polarized along the slow axis. Light exiting the fiber at the output facet was coupled into a single-mode collection fiber and detected using a single-photon-counting module (SPCM). The time delay of each detection event relative to the laser trigger was recorded to build up a histogram of detection events. The resulting histograms show a comb structure of regular peaks spaced by $\tau_{rt} = 12.67$ ns (×1 cavity round trip) and decaying over several microseconds. The left axis of FIG. 10 shows coating transmission as a function of wavelength on (a) a log scale and (b) a linear scale (inset). Wavelengths of the q-control (solid), p-control (dash-dot), s-signal (dots), and r-signal (dashed), are shown. The right axis of FIG. 10 shows measured cavity ring-down lifetime (crosses) as a function of wavelength, with 95% confidence intervals (shaded error bars). FIG. 10a (right axis) shows a plot of the ring-down lifetime extracted using a weighted linear regression on the summed counts in each "round trip" bin. The measured 1/e lifetime at 925 nm is $39.7(5)\tau_{rt}$, and this increases to $87(6)\tau_{rt}$ at 950 nm, where the reduced count rate limited further wavelength tuning. As expected from the short-wave-pass coating, the cavity lifetime increases with wavelength, since the optical density of the dielectric stack is also increasing. The cavity lifetimes are sufficiently long to offer promise for use as an FC-SWIFT memory.

The master laser is a Ti:sapphire regenerative amplifier operating at R=1 kHz; it outputs 80-fs pulses, with FWHM bandwidth $\Delta\lambda = 12$ nm centered at 800 nm. The laser output is filter with a 4f pulse shaper (see A. M. Weiner, J. P. Heritage, and E. M. Kirschner, "High-resolution femtosecond pulse shaping", J. Opt. Soc. Am. B 5, 1563 (1988)) to prepare control pulses at $\lambda_q = 790.1$ nm and $\lambda_p = 807.4$ nm, each with FWHM $\Delta\lambda = 0.4$ nm, corresponding to pulse durations of 2.3 ps. Distinct write and read pulse pairs are prepared using an imbalanced interferometer, with the read control pulses delayed by 12.67 ns relative to the write control pulses. Signal pulses are generated by frequency-doubling the 1.805 μm output from an optical parametric amplifier, pumped by the master laser; the doubled light is spectrally filtered in a second 4f pulse shaper. The signal pulses have a bandwidth of $\Delta\lambda_s = 1.05$ nm centered at $\lambda_s = 902.5$ nm, corresponding to a pulse duration of $\Delta\tau_s = 1.1$ ps. These input wavelengths give a storage wavelength of $\lambda_r = 925$ nm. The control pulses are combined with the signal pulse at a beam splitter and coupled into the EFC PM fiber. The coating-corrected coupling efficiencies for the write and read controls were $\eta_q^w = 0.50(3)$, $\eta_p^w = 0.41(3)$ and $\eta_q^r = 0.44(3)$, $\eta_p^r = 0.38(3)$, respectively. Control pulse energies were set to deliver $W_q^{out} = W_p^{out} = 2.2(3)$ nJ at the fiber exit facet, signal photons polarized on the fiber-cavity fast and slow axes are coupled to separate single mode fibers (SMFs). Interference filters are arranged prior to the fast-and slow-axis collection fibres to give transmission windows of $\approx 3$ nm bandwidth at 902.5 nm and 925 nm, respectively. The collection fibers are each coupled to SPCMs, and detection events are tagged relative to the laser trigger.

Figure 11:
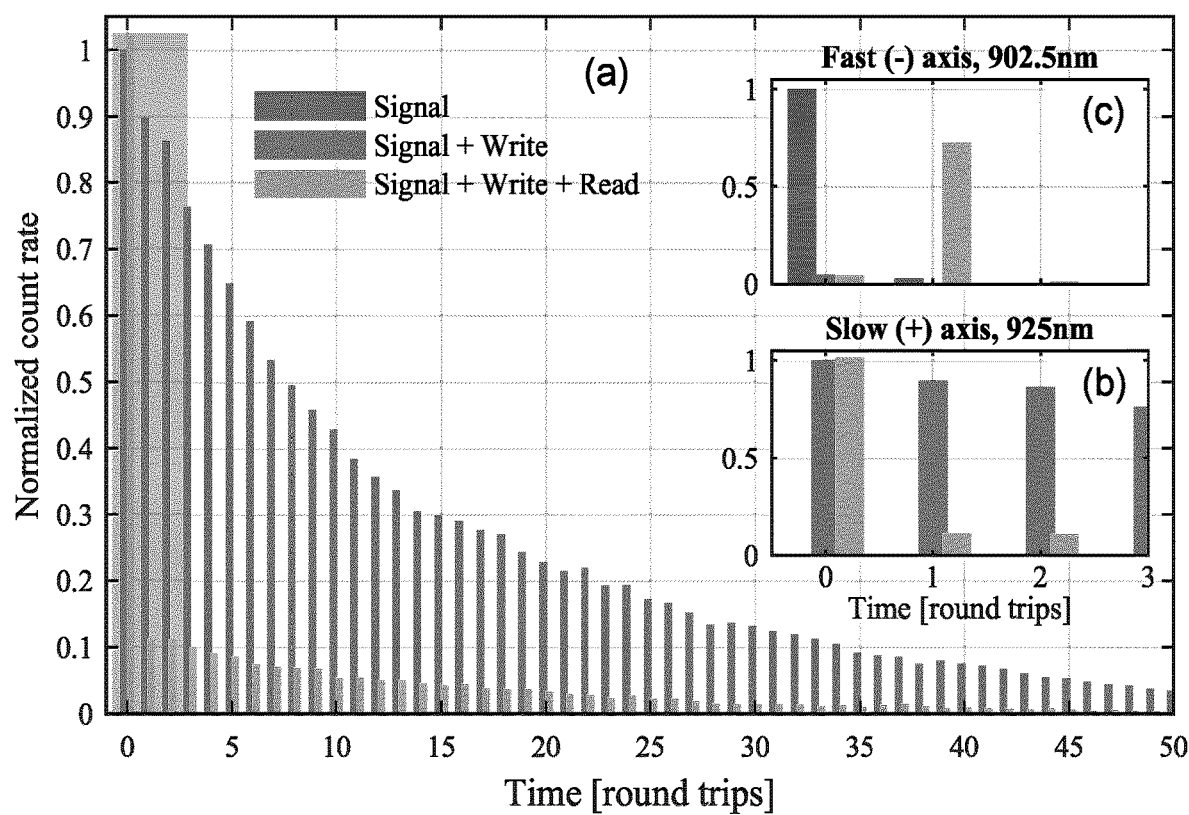

The memory operation is characterized using bright signal pulses input with polarization along the fiber fast axis; we insert neutral density filters before the collection fibres to avoid saturating the SPCMs. FIG. 11 shows histograms of the counts, normalized to the rate at T=0, measured on (a, b) the slow axis and (c) the fast axis for a bright signal pulse input on the fast axis with: no control pulses; wrote control on; and write and read controls on. FIG. 11a shows ring-down showing storage of the signal pulse circulating in the cavity. The shaded region corresponds to the interval plotted in the insets. FIG. 11b shows that readout at T=1 reduces the number of photons circulating in the cavity on the slow axis. FIG. 11c shows storage at T=0 and read-out at T=1 (12.67 ns delay). FIG. 11 plots the normalized SPCM count rate on (a, b) the slow axis and (c) the fast axis, after time-tagging and binning the detection events relative to the laser trigger. The count rates are plotted as a function of round trip number $T = t/\tau_{rt}$, where t is time. First, the write step is considered, comparing the results with the write controls off and on. For optimal delay between the signal and write p-, q-control pulses, the fast axis count rate at T=0 is diminished with write efficiency $\eta_w = 0.95(2)$ (see FIG. 11c). On the slow axis, a clear ring down signal is observed (red bars), with a 1/e lifetime of approximately $\tau_c \approx 16\tau_{rt} \approx 206$ ns, showing that signal photons have been red-shifted and polarization-switched on to the slow axis such that they are trapped within the cavity. Applying the read control pulses at a write-read delay of 12.67 ns, corresponding to one round trip of the cavity, it is observed that the slow axis count rate at T=1 reduces by a factor $\eta_r = 0.87(4)$ and the count rate on the fast axis increases, showing that signal photons have been blue-shifted and polarization-switched back to the fast axis, such that they are released from the cavity. Comparing the fast axis count rates at T=1 with write and read control on, to the fast axis count rates at T=0 with the signal only, a total efficiency of $\eta_{tot} = 0.73(1)$ is measured.

Figure 12:
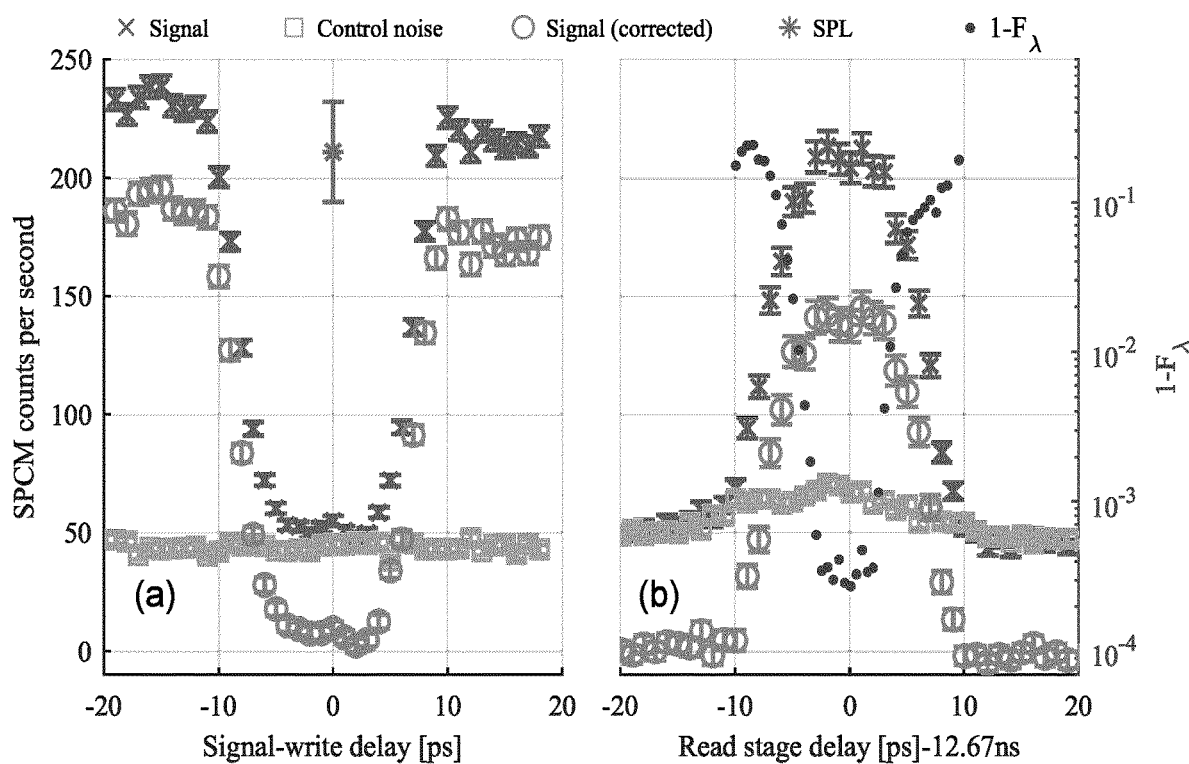

To characterize the memory at the quantum level, attenuate the signal prior to the fiber-cavity input was used. It was estimated that the count rate for single-photon-level (SPL) pulses in the fiber to be $R_{SPL} = RT_s\eta_c\eta_{SPCM} = 210(20)$ cps, where $T_s = 0.74(5)$ is the end-facet-coating transmission at the input signal wavelength, $\eta_c = 0.65(2)$ is the collection efficiency from the fiber-cavity exit facet to the SPCM, an $\eta SPCM = 0.44$ is the SPCM efficiency. The left axis of FIG. 12 shows fast axis count rate for an input signa; at the single-photon level (asterix) as a function (a) of signal delay relative to fixed write control pulses, and (b) of read stage delay relative to fixed write and signal stage delays. Plotted are the signal (crosses), noise (squares), and background-corrected signal (circles). Poisson error bars are shown for each case. The right axis of FIG. 12 shows at FIG. 12b (log-scale) the deviation of the classical spectral fidelity $F_\lambda$ from one, as a function of read control pulses' delay (dots). FIG. 12 (left axis) shows a plot of the signal, noise, and corrected-signal count rates as a function of (a) signal delay relative to fixed write control pulses, and (b) read-controls' delay relative to fixed write control pulses, and (b) read-controls' delay relative to fixed signal and write control pulses. The background-corrected efficiency is $\eta_{tot}^{SPL} = 0.70(4)$, consistent with the earlier measurement using bright signal pulses. The temporal profile of the delay scans is determined by the pulse durations and the group velocity walk-off between the signal and control pulses (see J. B. Christensen, J. G. Koefoed, B. A. Bell, C. J. McKinstrie, and K. Rottwitt, "Shape-preserving and unidirectional frequency conversion by four-wave mixing", Opt. Express 26, 17145 (2018)). In this instance, for the known pulse durations and analytic solutions (see J. B. Christensen, J. G. Koefoed, B. A. Bell, C. J. McKinstrie, and K. Rottwitt, "Shape-preserving and unidirectional frequency conversion by four-wave mixing", Opt. Express 26, 17145 (2018)), a temporal walk-off of $\Delta w$=16.6 ps is extracted; this is consistent with the expected walk-off of 17 ps, estimated using dispersion data. The maximum signal-to-noise ratio (SNR) is S=2.1(1) for a mean input photon number of 1.0(1) photons per pulse. The noise due to the write and read control pulses alone (FIG. 12b) is delay-dependent in the readout bin, reaching a maximum near the peak of the retrieved signal, indicating that the read control pulses are reading out noise photons created by the write control pulses.

Figure 13:
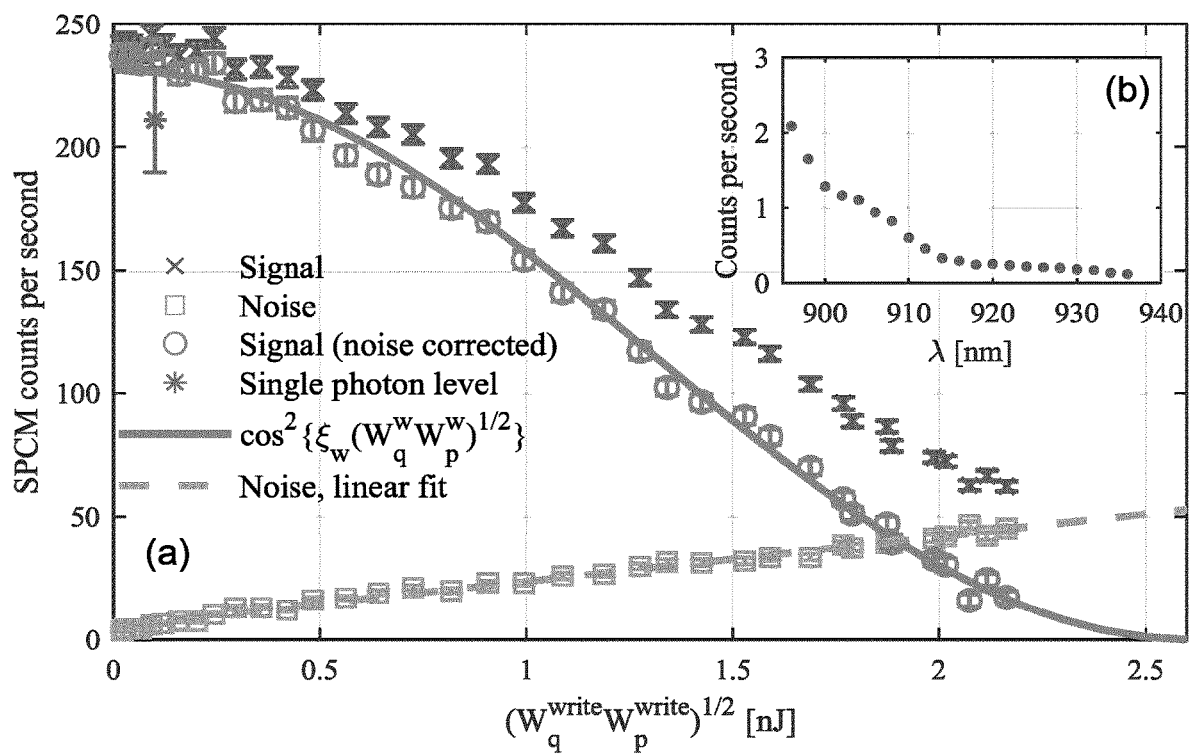

The input and output signal modes of BSFWM in a birefringent fiber are related by a beam-splitter formalism: the output signal pulse energy from the write interaction is expected to vary as $W_s^{out}=W_s^{in}\cos^2\{\xi_w\sqrt{W_q^w W_p^w}\}$, where depends on the pulse shapes and fiber parameters (see J. B. Christensen, J. G. Koefoed, B. A. Bell, C. J. McKinstrie, and K. Rottwitt, "Shape-preserving and unidirectional frequency conversion by four-wave mixing", Opt. Express 26, 17145 (2018)), and $W_{p,q}^w$ are the write pulse energies in the fiber. FIG. 13a shows signal (crosses), noise (squares), and noise-corrected signal (circles) as a function of control pulse energies for the write interaction. Fits to the noise-corrected signal (solid curve) and noise (dashed line) are plotted. FIG. 13b shows a plot of the fast axis (Raman) noise spectrum in an uncoated HB800 PM fiber. FIG. 13a is a plot of signal (crosses), noise (squares), noise-corrected signal (circles), and a fit of $W_s^{out}$ (solid line) as a function of $\sqrt{W_q^w W_p^w}$. The fit to the noise corrected signal has good qualitative agreement and $R^2$=0.996. A weighted lines regression on the nose data gives good fit with $R^2$>0.98. To gain further understanding of the noise process, the EFC fiber was exchanged for an uncoated fiber of similar length and the noise spectrum was measured from the write control pulses. FIG. 13b shows the broadband noise spectrum gradually decreasing with increasing wavelength. This spectrum and the linear power dependence of the noise are consistent with spontaneous Raman scattering from the control pulses as the dominant source of noise.

For a quantitative comparison of the memory operation, using bright signal pulses the classical spectral fidelity $F_\lambda=\int d\lambda \sqrt{I_{in}(\lambda)I_{out}(\lambda)}/[\sqrt{\int d\lambda I_{in}(\lambda)}\cdot\sqrt{\int d\lambda I_{out}(\lambda)}]$ is measured between the signal spectral intensity without ($I_{in}$) and with ($I_{out}$) the memory interaction, assuming constant spectral phase. An ideal memory with have $F_\lambda$=1, such that the input and output spectra are identical apart from the group delay introduced by the memory. FIG. 12b plots 1−$F_\lambda$(right axis) as a function of the read stage delay, showing maximum spectral fidelity of $F_{max}$>99.97% at the optimum delay. Comparing the fidelity plot with the SPL readout plot, it can be seen that the read efficiency and spectral fidelity are both reduced when the read delays are such that the signal pulse only completes a partial "collision" with the Bragg grating created by the control pulses. At these delay settings, the effect of cross-phase modulation from the controls is not symmetric on the signal, such that the signal is partially red-shifted or blue-shifted relative to the input spectrum, and the spectral fidelity diminishes.

For end-facet coatings with unit reflectivity, the maximum lifetime possible at the current cavity length is ~338$\tau_{rt}$, given the quoted fiber loss of ~5 dB/km. The lifetime measured in FIG. 11 is $\tau_c\approx 16\tau_{rt}$, whereas the lifetime when measured with a resonant signal probe at $\lambda r$=925 nm was $\tau_c$=39.7(4)$\tau_{rt}$; the lifetime at 950 nm was $\tau_c$=87(6)$\tau_{rt}$. At input pulse energies of $W_{in}\approx$8-10 nJ, irreparable damage was observed to EFC fibers and therefore restricted the operating range to $W_{in}$<7.5 nJ. The decrease in the lifetime was attributed to coating damage caused by the control pulses. It is expected that better mode matching and improved coating designs will reduce the power requirements, enhancing the cavity lifetime and durability. The pulse energy restrictions also limited the total efficiency. Unit frequency translation efficiency was not achieved by the inventors in either write or read steps, the inventors were able to measure translation efficiencies as high as 98% in an uncoated fiber, suggesting that higher memory efficiencies should be possible with design improvements.

The maximum SNR demonstrated at the SPL was S=2.1 (1), with Raman scattering from the control pulses as the dominant noise source. This memory SNR is insufficient for practical applications; nonetheless, significant improvements should be possible. For example, the Raman gain of silica diminishes significantly for shifts around ≥40 THz (see R. H. Stolen, J. P. Gordon, W. J. Tomlinson, and H. A. Haus, "Raman response function of silica-core fibers, J. Opt. Soc. Am. B 6, 1159 (1989)); the effect of noise should reduce with increased signal-control detuning. Alternatively, if signal frequencies were on the anti-Stokes side of the control wavelengths, the Raman noise would be further reduced. Finally, in designs with smaller control-signal separations, cooling the fiber may be used to reduce Raman noise (H. Takesue and K. Inoue, "1.5-μm band quantum-correlated photon pair generation in dispersion-shifted fiber: suppression of noise photons by cooling fiber", Opt. Express 13, 7832 (2005)).

In this experiment, the inventors were limited to reading out in a single time bin. For practical use, a memory must be able to store and retrieve photons "on demand", or at least in synchronization with an appropriate clock rate. To accommodate this periodicity, the inventors expect that an external modelocked laser, or lasers, can be locked to the fiber-cavity frequency, allowing control over the write and read interactions; the present sample should be compatible with 80-MHz lasers oscillators. Combined with improvements to the cavity design, use of synchronous control lasers should enable retrieval in ~100 round trips, corresponding to microsecond storage times.

A practical memory must also achieve high fidelity between the input and retrieved states. Beyond the influence of noise and loss, any distortions introduced by the memory interaction will reduce the fidelity. Measurement of the classical spectral fidelity indicates that the spectrum is not significantly distorted by the two frequency conversions. Nonetheless, for longer storage times, dispersion will play an important role; for this reason, the FC-SWIFT memory may be most appropriate for telecom wavelengths where dispersion and loss are lowest. It may also be possible to compensate for fiber dispersion with a chirped dichroic end-facet coating.

The inventors stored THz-bandwidth SPL coherent states in an EFC birefringent fiber, using BSFWM to switch photons in and out of resonance with the dichroic reflective end facets, at a high efficiency. The inventors hope that the FC-SWIFT memory will be useful for synchronization and multiplexing of probabilistic photon sources (see B. J. Smith, P. Mahou, O. Cohen, J. S. Lundeen, and I. A. Walmsley, "Photon pair generation in birefringent optical fibers", Opt. Express 17, 23589 (2009)).

The embodiments of the invention described above are intended to be exemplary only. The scope of the invention is therefore intended to be limited solely by the scope of the appended claims.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the broad scope of the appended claims. All publications, patents and patent publications mentioned in this specification are herein incorporated in their entirely be reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A fibre optic quantum memory for storing a quantum state of light, comprising of:
   an optical fibre having an optical cavity integrated into the optical fibre; reflective elements integrated within the optical fibre at opposing ends of the optical fibre, the respective elements forming a part of the optical fibre; and
   a nonlinear optical switching mechanism for selectively storing within the cavity quantum light from an external source;
   wherein the first application of the switching mechanism modifies at least one property of the quantum light such that the reflective elements trap the quantum light within the cavity,
   wherein a subsequent application of the switching mechanism modifies the at least one property of the quantum light such that the quantum light exits the cavity, and wherein quantum information encoded in the quantum light is preserved during storage in the cavity.

2. The fibre optic quantum memory of claim 1, wherein the optical switching mechanism comprises Bragg-scattering four-wave mixing.

3. The fibre optic quantum memory of claim 1, wherein the optical switching mechanism comprises cross-phase modulation.

4. The fibre optic quantum memory of claim 1, wherein the optical switching mechanism comprises rotating the polarization of the quantum light via the optical Kerr effect.

5. The fibre optic quantum memory of claim 1, wherein the at least one property of the quantum light comprises frequency, polarization, or both.

6. The fibre optic quantum memory of claim 1, wherein at least one of the reflective elements comprises a fibre Bragg grating defining a fibre mirror.

7. The fibre optic quantum memory of claim 6, wherein the optical switching mechanism comprises shifting the resonance frequency of the fibre Bragg grating via the optical Kerr effect.

8. The fibre optic quantum memory of claim 1, wherein at least one of the reflective elements comprises dielectric stacks coated directly on the tip of the fibre.

9. The fibre optic quantum memory of claim 1 wherein the quantum state of light comprises a single photon.

10. A fibre optic quantum memory comprising:
    an optical fibre having an optical cavity integrated into the optical fibre, and reflective elements integrated within the optical fibre at opposing ends of the optical fibre, the respective elements forming a part of the optical fibre;
    a photon pair source integrated therein, the photon source comprising a photon pair generating mechanism for creating an entangled photon pair within the cavity using a spontaneous process; and
    a nonlinear optical switching mechanism for selectively extracting a photon of the photon pair from the cavity;
    wherein the first photon of the photon pair is resonant with the reflective elements in the cavity so the first photon is retained in the cavity,
    wherein the second photon of the photon pair is not resonant with the reflective elements so the second photon exits the cavity, and is used to herald a presence of the first photon retained in the cavity;
    wherein subsequent application of a nonlinear optical switching mechanism permits the photon retained in the cavity to exit the cavity.

11. The fibre optic quantum memory of claim 10, wherein the at least one property of the photon comprises frequency, polarization, or both.

12. The fibre optic quantum memory of claim 10, wherein the spontaneous process comprises spontaneous four-wave mixing.

13. The fibre optic quantum memory of claim 10, wherein the nonlinear optical switching mechanism selectively extracts the photon of the photon pair by modifying at least one property of the photon of the photon pair, and wherein subsequent application of the nonlinear optical switching mechanism modifies the at least one property of the stored photon to permit the photon retained in the cavity to exit the cavity.

14. The fibre optic quantum memory of claim 10, wherein the nonlinear optical switching mechanism selectively extracts the photon of the photon pair by modifying at least one property of at least one reflective element in the cavity, and wherein subsequent application of the nonlinear optical switching mechanism modifies the at least one property of the at least one reflective element to permit the photon retained in the cavity to exit the cavity.

15. A fibre optic quantum memory for storing a quantum state of light, comprising of:
    an optical fibre having an optical cavity integrated into the optical fibre; reflective elements integrated within the optical fibre at opposing ends of the optical fibre, the respective elements forming a part of the optical fibre; and
    a nonlinear optical switching mechanism that can temporarily modify at least one property of the reflective element such that it transmits an incident quantum state of light;
    wherein application of the switching mechanism temporarily modifies at least one property of at least one of the reflective elements such that the incident quantum light is transmitted into the cavity, wherein the absence of the switching mechanism means that the quantum light is trapped in the cavity between the two reflective elements;

wherein a subsequent application of the switching mechanism temporarily modifies at least one property of a reflective element such that the trapped quantum light exits the cavity; and wherein quantum information encoded in the quantum light is preserved during storage in the cavity.

* * * * *